(12) United States Patent
Okita et al.

(10) Patent No.: US 9,293,574 B2
(45) Date of Patent: Mar. 22, 2016

(54) SEMICONDUCTOR DEVICE AND METHOD OF MANUFACTURING SEMICONDUCTOR DEVICE

(71) Applicant: PANASONIC CORPORATION, Osaka (JP)

(72) Inventors: Hideyuki Okita, Toyama (JP); Yasuhiro Uemoto, Toyama (JP); Masahiro Hikita, Toyama (JP); Akihiko Nishio, Ishikawa (JP); Hidenori Takeda, Nara (JP); Takahiro Sato, Toyama (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 93 days.

(21) Appl. No.: 14/254,520

(22) Filed: Apr. 16, 2014

(65) Prior Publication Data

US 2014/0225161 A1    Aug. 14, 2014

Related U.S. Application Data

(63) Continuation of application No. PCT/JP2012/007075, filed on Nov. 5, 2012.

(30) Foreign Application Priority Data

Nov. 18, 2011    (JP) .................................. 2011-252550

(51) Int. Cl.
  *H01L 29/66*    (2006.01)
  *H01L 29/78*    (2006.01)
  (Continued)

(52) U.S. Cl.
  CPC ............ *H01L 29/78* (2013.01); *H01L 29/0657* (2013.01); *H01L 29/42316* (2013.01);
  (Continued)

(58) Field of Classification Search
  CPC .............. H01L 29/78; H01L 29/66431; H01L 29/42316; H01L 29/66462; H01L 29/7787; H01L 29/0657; H01L 29/1066; H01L 29/2003
  See application file for complete search history.

(56) References Cited

U.S. PATENT DOCUMENTS 5,471,077 A * 11/1995 Sokolich ........... H01L 21/28581
                                                      257/192
6,066,865 A *  5/2000 Cerny ............... H01L 21/28581
                                                      257/194
(Continued)

FOREIGN PATENT DOCUMENTS

JP      11-297713 A    10/1999
JP    2004-022774 A     1/2004
(Continued)

OTHER PUBLICATIONS

International Search Report issued in International Application No. PCT/JP2012/007075 mailed Dec. 18, 2012, with English translation, 4 pgs.

*Primary Examiner* — Jarrett Stark
(74) *Attorney, Agent, or Firm* — McDermott Will & Emery LLP

(57) ABSTRACT

A semiconductor device includes: a first nitride semiconductor layer; a second nitride semiconductor layer above the first nitride semiconductor layer and having a band gap larger than that of the first nitride semiconductor layer; a p-type nitride semiconductor layer above the second nitride semiconductor layer; two third nitride semiconductor layers of n-type above the second nitride semiconductor layer and located separately on either side of the p-type nitride semiconductor layer; and a first ohmic electrode above one of the two third nitride semiconductor layers and a second ohmic electrode above the other of the two third nitride semiconductor layers; and a gate electrode above the p-type nitride semiconductor layer. The second nitride semiconductor layer includes, in a region above which neither the p-type nitride semiconductor layer nor the two third nitride semiconductor layers is located, a surface layer including p-type impurities identical to those in the p-type nitride semiconductor layer.

14 Claims, 17 Drawing Sheets

(51) Int. Cl.
*H01L 29/423* (2006.01)
*H01L 29/778* (2006.01)
*H01L 29/06* (2006.01)
*H01L 29/20* (2006.01)
*H01L 29/10* (2006.01)

(52) U.S. Cl.
CPC .... *H01L29/66431* (2013.01); *H01L 29/66462* (2013.01); *H01L 29/7787* (2013.01); *H01L 29/1066* (2013.01); *H01L 29/2003* (2013.01)

(56) References Cited

U.S. PATENT DOCUMENTS

| | | | |
|---|---|---|---|
| 7,109,100 B2* | 9/2006 | Nakamura | H01L 21/2258 257/E21.152 |
| 7,635,877 B2 | 12/2009 | Waki et al. | |
| 7,868,355 B2 | 1/2011 | Sato | |
| 8,598,628 B2* | 12/2013 | Hikita | H01L 29/42316 257/192 |
| 9,136,116 B2* | 9/2015 | Bour | H01L 21/0254 |
| 2002/0003245 A1* | 1/2002 | Kato | H01L 21/28587 257/279 |
| 2005/0236646 A1 | 10/2005 | Waki et al. | |
| 2007/0176215 A1 | 8/2007 | Yanagihara et al. | |
| 2009/0212325 A1* | 8/2009 | Sato | H01L 29/1066 257/192 |
| 2012/0061729 A1 | 3/2012 | Shibata et al. | |
| 2015/0311331 A1* | 10/2015 | Yamada | H01L 29/7787 257/76 |

FOREIGN PATENT DOCUMENTS

| | | |
|---|---|---|
| JP | 2005-311028 A | 11/2005 |
| JP | 2007-201279 A | 8/2007 |
| JP | 2009-200395 A | 9/2009 |
| JP | 2010-165987 A | 7/2010 |
| JP | 2010-212495 A | 9/2010 |
| JP | 2011-029247 A | 2/2011 |

* cited by examiner

· · · · · Ohmic electrode/n'-GaN/AlGaN

——— Ohmic electrode/AlGaN

SEMICONDUCTOR DEVICE AND METHOD OF MANUFACTURING SEMICONDUCTOR DEVICE

CROSS REFERENCE TO RELATED APPLICATIONS

This is a continuation application of PCT International Application No. PCT/JP2012/007075 filed on Nov. 5, 2012, designating the United States of America, which is based on and claims priority of Japanese Patent Application No. 2011-252550 filed on Nov. 18, 2011. The entire disclosures of the above-identified applications, including the specifications, drawings and claims are incorporated herein by reference in their entirety.

FIELD

The present disclosure relates to semiconductor devices and methods of manufacturing the semiconductor devices. The present disclosure particularly relates to a semiconductor device which comprises semiconductors, such as group-III nitride semiconductors, usable for a power transistor or the like, and a method of manufacturing such a device.

BACKGROUND

Group-III nitride semiconductors, GaN and AlGaN in particular, have a high breakdown voltage due to their wide band gap. GaN and AlGaN facilitate formation of a hetero structure, such as AlGaN/GaN. In a hetero structure such as AlGaN/GaN, a channel with higher concentrations of electrons (two-dimensional electron gas layer, 2DEG layer) is generated on the GaN layer side at the AlGaN/GaN interface, by piezoelectricity caused due to lattice constant difference between AlGaN and GaN and by their band gap difference. This allows large current and high speed operations. In view of this, group-III nitride semiconductors are expected to be applied to electronic devices, such as a power field effect transistor (FET) or a diode.

Due to the large current operation, for example, a hetero-FET (HFET, not illustrated), with a general planar AlGaN/GaN structure having an Al composition of 25% and a thickness of 20 nm, is normally on with a negative threshold voltage. In the light of safety, however, there is a strong demand for a general circuit which includes a power FET to be normally off with a positive threshold voltage.

FIG. 1 illustrates an example of a cross-sectional structure of a general normally-off AlGaN/GaN-HFET disclosed in Patent Literature (PTL) 1. The AlGaN/GaN-HFET illustrated in FIG. 1 is formed as described below.

First, a group-III nitride semiconductor (for example, GaN) serving as a channel layer 1 is formed on, for example, a given substrate (such as a substrate of Sic, Sapphire, Si or GaN, not illustrated), or a buffer layer (a buffer layer comprising a combination of different group-III nitride semiconductors, in particular AlN, AlGaN, GaN and the like, not illustrated). Subsequently, a carrier supply layer 2 (for example, AlGaN) is formed which has a band gap larger than that of the channel layer 1, and a 2DEG layer 3 is generated on the channel layer side at the interface between the channel layer 1 and the carrier supply layer 2.

Subsequently, a capping layer 4 comprising a p-type group-III nitride semiconductor (for example, p-AlGaN) is selectively formed, and a source electrode 5a and a drain electrode 5b which form ohmic contacts are sequentially formed. A gate electrode 6 which forms an ohmic contact or Schottky contact is formed on the p-type capping layer 4 located between the source electrode 5a and the drain electrode 5b. Here, the source electrode 5a and the drain electrode 5b may be arranged at any position as long as the source electrode 5a and the drain electrode 5b are separately located on either side of the p-type capping layer 4. The ohmic electrodes may contact, for example, the group-III nitride semiconductor carrier supply layer 2 or the group-III nitride semiconductor channel layer 1 (that is, an ohmic recess structure may be provided).

The carrier supply layer 2 of group-III nitride semiconductor is generally of n-type. Hence, a natural depletion layer is formed between the p-type capping layer 4 and the carrier supply layer 2, and thus, a depletion region is created in a state where no voltage is applied to the gate electrode 6. Hence, the carrier supply layer 2 below the gate can be thick in order to achieve normally-off operation. In order to facilitate understanding, FIG. 1 illustrates a state where the gate electrode 6 is positively biased and the 2DEG layer 3 is generated below the gate.

Each of the source electrode 5a and the drain electrode 5b comprises an electrode including one metal or two or more metals selected from among Ti, Al, Mo, Hf, and the like. The gate electrode 6 comprises an electrode including one metal or two or more metals selected from among Ti, Al, Ni, Pt, Pd, Au, and the like.

Furthermore, for a power device, reduction in on-resistance (Ron) of a FET is important as well as normally-off operation.

Ron is a resistance value obtained from the slope of current rise of Ids-Vds characteristics of a device. It is ideal for a power device to have Ron that is as low as possible within a desired withstand voltage range. Ron is approximately equal to a sum of source resistance (Rs: source-gate resistance), drain resistance (Rd: gate-drain resistance), and channel resistance below the gate (Rch: resistance of the channel immediately below the gate). Strictly speaking, Ron also includes interconnection resistance, but it is omitted here. Accordingly, it is necessary to reduce Rs, Rd, and Rch to reduce Ron.

Rch depends on the gate length or sheet resistance of an epitaxial substrate; and thus, there is a limit on reduction in Rch. Rd is mainly defined by the contact resistance (Rc) of the drain electrode and the sheet resistance of an epitaxial substrate between the gate and drain electrodes. In order to ensure withstand voltage of a high-voltage power device, however, a certain level of gate to drain distance (Lgd) is necessary. Hence, reduction in Rc is important to reduce Rd. Rs is mainly defined by the contact resistance (Rc) of the source electrode and the sheet resistance of an epitaxial substrate between the source and gate electrodes. Rs is not related to withstand voltage, and thus, it is better to reduce Rs as much as possible to improve Ron.

Although the sheet resistance of the epitaxial substrate between the source and gate electrodes significantly depends on the source-to-gate distance, the source-to-gate distance is defined to a given minimum distance in the light of process margin. Hence, there is a limit on reduction in the sheet resistance of the epitaxial substrate between the source and gate electrodes.

In conclusion, reduction in Rc and in sheet resistance of the epitaxial substrate between the source and gate electrodes are important to reduce Ron. In particular, since Rc exists both on the source electrode side and the drain electrode side, reduction in Rc has a double effect. Hence, reduction in Rc is the most important to reduce Ron.

FIG. 2 illustrates an example of a cross-sectional structure of a general AlGaN/GaN-HFET with a reduced contact resistance disclosed in PTL 2. The AlGaN/GaN-HFET illustrated in FIG. 2 is formed as described below.

First, a group-III nitride semiconductor (for example, GaN) serving as a channel layer 8 is formed on, for example, a given substrate (such as a substrate of Sic, Sapphire, Si or GaN, not illustrated), or a buffer layer (a buffer layer comprising a combination of different group-III nitride semiconductors, in particular, AlN, AlGaN, GaN and the like, not illustrated). Subsequently, a carrier supply layer 9 (for example, AlGaN) is formed which has a band gap larger than that of the channel layer 8, and a 2DEG layer 10 is generated on the channel layer side at the interface between the channel layer 8 and the carrier supply layer 9.

Subsequently, a capping layer 11 comprising a group-III nitride semiconductor doped with n-type dopant such as Si (for example, n-GaN) is formed, and a second capping layer 12 comprising a group-III nitride semiconductor (for example, AlGaN) is further formed. The surface of the stack of the group-III nitride semiconductors is etched by a known dry etching technique to form a recessed portion 13.

Subsequently, a source electrode 14a and a drain electrode 14b which form ohmic contacts are formed on the second capping layer 12 other than the recessed portion, and a gate electrode 15 which forms a Schottky contact is formed in the recessed portion 13. Each of the source electrode 14a and the drain electrode 14b comprises an electrode including one metal or two or more metals selected from among Ti, Al, Mo, Hf, and the like. The gate electrode 15 comprises an electrode including one metal or two or more metals selected from among Ni, Pt, Pd, Au, and the like.

FIG. 3 illustrates an example of a cross-sectional structure of an AlGaN/GaN-HFET in which a method of reducing contact resistance is applied to group-III nitride semiconductors. The method uses an $n^+$ doped capping layer and is widely used for GaAs, too. The AlGaN/GaN-HFET illustrated in FIG. 3 is formed as described below.

First, a group-III nitride semiconductor (for example, GaN) serving as a channel layer 16 is formed on, for example, a given substrate (such as a substrate of Sic, Sapphire, Si or GaN, not illustrated), or a buffer layer (a buffer layer comprising a combination of different group-III nitride semiconductors, in particular, AlN, AlGaN, GaN and the like, not illustrated). Subsequently, a carrier supply layer 17 (for example, AlGaN) which has a band gap larger than that of the channel layer 16 is formed, and a 2DEG layer 18 is generated on the channel layer side at the interface between the channel layer 16 and the carrier supply layer 17.

Then, an n-type capping layer 19 is formed which comprises a group-III nitride semiconductor heavily doped with n-type dopant, such as Si, (for example, $n^+$-GaN). The surface of the stack of the group-III nitride semiconductors is etched by a known dry etching technique (or selectively etched) to form a recessed portion 20.

Subsequently, a source electrode 21a and a drain electrode 21b which form ohmic contacts are formed on the n-type capping layer 19 other than the recessed portion, and a gate electrode 22 which forms a Schottky contact is formed in the recessed portion 20. Each of the source electrode 21a and the drain electrode 21b comprises an electrode including one metal or two or more metals selected from among Ti, Al, Mo, Hf, and the like. The gate electrode 22 comprises an electrode including one metal or two or more metals selected from among Ni, Pt, Pd, Au, and the like.

CITATION LIST

Patent Literature

[PTL 1] Japanese Unexamined Patent Application Publication No. 2011-29247
[PTL 2] Japanese Unexamined Patent Application Publication No. 2004-022774

SUMMARY

Technical Problem

The conventional techniques, however, encounter problems in manufacturing a normally-off HFET comprising group-III nitride semiconductors.

In a general planar HFET (normally-on HFET, not illustrated) with a AlGaN/GaN structure, ohmic electrodes that are a source electrode and a drain electrode are formed on the surface of AlGaN serving as a carrier supply layer to form ohmic contacts. This requires current to flow penetrating AlGaN which has a high barrier height, which results in high contact resistance (Rc) of 1 to 3 ohm-mm or more.

Furthermore, in the normally-off FET structure disclosed in PTL 1 which includes a p-type capping layer, in the process of forming the p-type capping layer, Mg that are p-type impurities inevitably diffuse into the surface of the carrier supply layer. After that, the p-type capping layer in a region other than the gate region is selectively removed by a selective dry etching technique to form ohmic electrodes on the surface of the carrier supply layer. Due to diffusion of Mg, however, the carrier supply layer surface turns into a p-type layer or has a high resistance. This is likely to case poor ohmic contacts, which may result in Rc of 5 ohm-mm or more.

In order to solve such a problem, a conventional ohmic recess structure is used where ohmic electrodes directly contact the interface of AlGaN/GaN having no diffusion of Mg so as to directly contact the 2DEG layer. Such a method, however, can reduce Rc only to approximately 0.8 ohm-mm at most.

Even if a technique disclosed in PTL 2 or a known technique of reducing contact resistance using an $n^+$ doped capping layer (hereinafter, referring to as an n-type capping layer) is applied to the normally-off FET structure including the p-type capping layer disclosed in PTL 1, some problems occur.

First, the p-type capping layer and the n-type capping layer need to be formed on the same carrier supply layer, which complicates the manufacturing method. More specifically, the p-type capping layer or the n-type capping layer has to be formed first.

For example, selectively forming the p-type capping layer disclosed in PTL 1 and then growing the n-type capping layer by a metal organic chemical vapor deposition (MOCVD) or the like requires a complicated manufacturing method. Specifically, after protecting the p-type capping layer using a mask, such as $SiO_2$, to prevent the n-type capping layer from growing on the p-type capping layer, the n-type capping layer is selectively grown, and then, the mask of $SiO_2$ or the like, is removed. This method is technically very difficult because, for example, use of a mask of $SiO_2$ or the like prevents a group-III nitride semiconductor from growing in a region that is near the side surface of $SiO_2$ and is uncovered with the mask.

In addition, in a similar manner, formation of the n-type capping layer first and then the p-type capping layer also requires a complicated manufacturing method. Specifically, in a similar manner, after the n-type capping layer is protected using a mask of $SiO_2$ or the like, the p-type capping layer is selectively grown, and the mask of $SiO_2$ or the like is removed.

One non-limiting exemplary embodiment provides a semiconductor device which comprises group-III nitride semiconductors and which achieves normally-off operation and significantly reduced ohmic contact resistance of ohmic electrodes that are source and drain electrodes, and a method of manufacturing the semiconductor device.

Solution to Problem

In order to achieve the above object, a semiconductor device according to an aspect of the present disclosure includes: a substrate; a first nitride semiconductor layer above the substrate; a second nitride semiconductor layer above the first nitride semiconductor layer and having a band gap larger than a band gap of the first nitride semiconductor layer; a p-type nitride semiconductor layer above a portion of the second nitride semiconductor layer; two third nitride semiconductor layers of n-type and above the second nitride semiconductor layer, the two third nitride semiconductor layers being located separately on either side of the p-type nitride semiconductor layer; and a first ohmic electrode and a second ohmic electrode, the first ohmic electrode being located above one of the two third nitride semiconductor layers, the second ohmic electrode being located above the other of the two third nitride semiconductor layers; and a gate electrode above the p-type nitride semiconductor layer. The second nitride semiconductor layer includes, in a region above which neither the p-type nitride semiconductor layer nor the two third nitride semiconductor layers is located, a surface layer including a p-type impurity identical to a p-type impurity included in the p-type nitride semiconductor layer.

Furthermore, in order to achieve the object, a semiconductor device according to another aspect of the present disclosure is a nitride semiconductor device including: a substrate; a first nitride semiconductor layer above the substrate; a second nitride semiconductor layer above the first nitride semiconductor layer and having a band gap larger than a band gap of the first nitride semiconductor layer; a p-type nitride semiconductor layer above a portion of the second nitride semiconductor layer; two third nitride semiconductor layers of n-type and above the second nitride semiconductor layer, one of the two third nitride semiconductor layers being located on one side of the p-type nitride semiconductor layer and the other of the two third nitride semiconductor layers being located on the other side of the p-type nitride semiconductor layer; a first ohmic electrode and a second ohmic electrode, the first ohmic electrode being located above one of the two third nitride semiconductor layers, the second ohmic electrode being located above the other of the two third nitride semiconductor layers; a gate electrode above the p-type nitride semiconductor layer; and a fourth nitride semiconductor layer between the first ohmic electrode and the one of the two third nitride semiconductor layers, between the second ohmic electrode and the other of the two third nitride semiconductor layers, and between the second nitride semiconductor layer and the p-type nitride semiconductor layer, the fourth nitride semiconductor layer comprising a material composition inactive to an etching gas used for the p-type nitride semiconductor layer.

Furthermore, in order to achieve the object, a method of manufacturing a semiconductor device according to an aspect of the present disclosure includes preparing a substrate; forming a first nitride semiconductor layer above the substrate; stacking, above the first nitride semiconductor layer, a second nitride semiconductor layer having a band gap larger than a band gap of the first nitride semiconductor layer; stacking a third nitride semiconductor layer above the second nitride semiconductor layer; selectively removing a portion of the third nitride semiconductor layer to form a first capping layer comprising the third nitride semiconductor layer; stacking a p-type nitride semiconductor layer so as to cover the second nitride semiconductor layer and the first capping layer; selectively removing a portion of the p-type nitride semiconductor layer to form a second capping layer comprising the p-type nitride semiconductor layer; forming a first ohmic electrode and a second ohimc electrode above the first capping layer; and forming a gate electrode above the second capping layer.

Furthermore, in order to achieve the object, a method of manufacturing a semiconductor device according to another aspect of the present disclosure includes preparing a substrate; forming a first nitride semiconductor layer above the substrate; stacking, above the first nitride semiconductor layer, a second nitride semiconductor layer having a band gap larger than a band gap of the first nitride semiconductor layer; stacking a third nitride semiconductor layer above the second nitride semiconductor layer; selectively removing a portion of the third nitride semiconductor layer to form a first capping layer comprising the third nitride semiconductor layer; stacking an etching stopper layer comprising a fourth nitride semiconductor layer and a p-type nitride semiconductor layer so as to cover the second nitride semiconductor layer and the first capping layer; selectively removing a portion of the p-type nitride semiconductor layer above the etching stopper layer to form a second capping layer comprising the p-type nitride semiconductor layer; forming a first ohmic electrode and a second ohimc electrode above the etching stopper layer located above the first capping layer and; and forming a gate electrode above the second capping layer.

Furthermore, in order to achieve the object, a method of manufacturing a semiconductor device according to an aspect of the present disclosure includes: preparing a substrate; forming a first nitride semiconductor layer above the substrate; stacking, above the first nitride semiconductor layer, a second nitride semiconductor layer having a band gap larger than a band gap of the first nitride semiconductor layer; stacking a third nitride semiconductor layer above the second nitride semiconductor layer; selectively removing a portion of the third nitride semiconductor layer to form a first capping layer comprising the third nitride semiconductor layer; forming a recessed portion in a portion of the second nitride semiconductor layer; stacking an etching stopper layer comprising a fourth nitride semiconductor layer and a p-type nitride semiconductor layer so as to cover the second nitride semiconductor layer, the first capping layer, and the recessed portion; selectively removing a portion of the p-type nitride semiconductor layer above the etching stopper layer to form a second capping layer comprising the p-type nitride semiconductor layer; forming a first ohmic electrode and a second ohimc electrode above the etching stopper layer located above the first capping layer; and forming a gate electrode above the second capping layer.

Furthermore, in order to achieve the object, a method of manufacturing a semiconductor device according to an aspect of the present disclosure includes: preparing a substrate; forming a first nitride semiconductor layer above the substrate; stacking, above the first nitride semiconductor layer, a second nitride semiconductor layer having a band gap larger than a band gap of the first nitride semiconductor layer; stacking a third nitride semiconductor layer above the second nitride semiconductor layer; selectively removing a portion of the third nitride semiconductor layer to form a first capping layer comprising the third nitride semiconductor layer; stacking an etching stopper layer comprising a fourth nitride semiconductor layer and a p-type nitride semiconductor layer so as to cover the second nitride semiconductor layer and the first capping layer; selectively removing a portion of the p-type nitride semiconductor layer above the etching stopper layer to form a second capping layer comprising the p-type nitride semiconductor layer; selectively removing a portion of the etching stopper layer above the first capping layer to form a first ohmic electrode and a second ohmic electrode which contact the third nitride semiconductor layer which has been exposed; and forming a gate electrode above the second capping layer.

Advantageous Effects

A semiconductor device according to an aspect of the present disclosure is capable of achieving normally-off operation and significantly reduced contact resistance. In addition, the semiconductor device can eliminate a factor for poor contact defect, such as diffusion of Mg.

Furthermore, a method of manufacturing a semiconductor device according to an aspect of the present disclosure provides reproducible and controllable manufacturing of a normally-off semiconductor device with significantly reduced contact resistance and good surface distribution of contact resistance.

BRIEF DESCRIPTION OF DRAWINGS

These and other objects, advantages and features of the invention will become apparent from the following description thereof taken in conjunction with the accompanying drawings that illustrate a specific embodiment of the present disclosure.

DESCRIPTION OF EMBODIMENTS

Hereinafter, referring to the attached drawings, descriptions are given of embodiments of the present disclosure. Each of the embodiments described below shows a specific example. The numerical values, shapes, materials, structural elements, the arrangement and connection of the structural elements, steps, the processing order of the steps etc. shown in the following embodiments are mere examples, and therefore do not limit the scope of the appended Claims and their equivalents. Therefore, among the structural elements in the following embodiments, structural elements not recited in any one of the independent claims are described as arbitrary structural elements.

Embodiment 1

Figure 1:
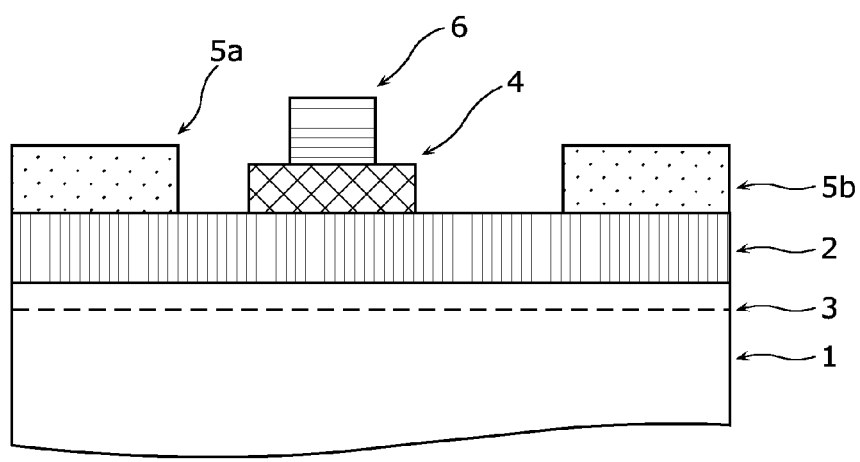
FIG. 1 is a schematic cross-sectional view illustrating an example of a structure of a nitride semiconductor device with a p-type capping layer.
Figure 2:
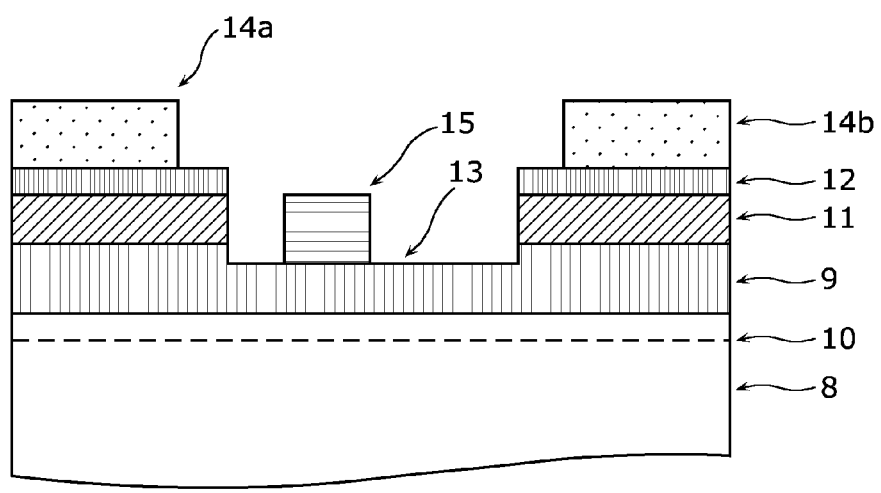
FIG. 2 is a schematic cross-sectional view illustrating an example of a structure of a nitride semiconductor device including a capping layer with low contact resistance.
Figure 3:
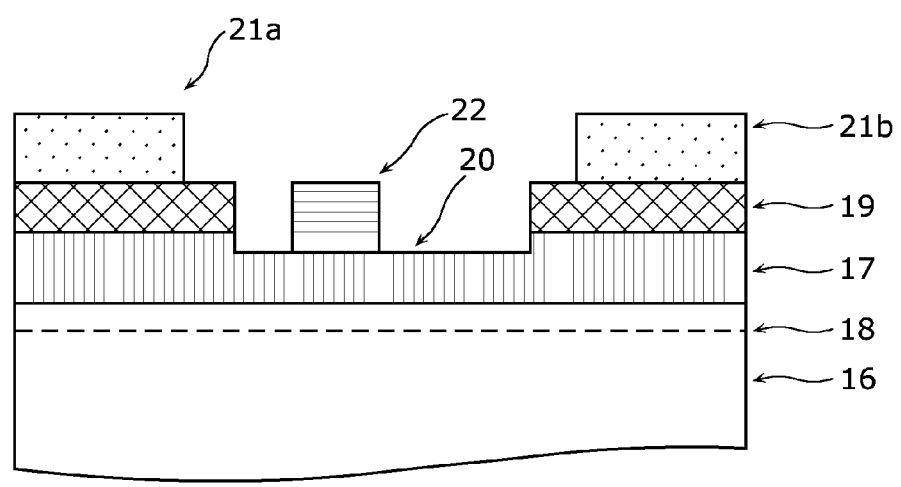
FIG. 3 is a schematic cross-sectional view illustrating an example of a structure of a nitride semiconductor device including an n$^+$-GaN capping layer.
Figure 4A:
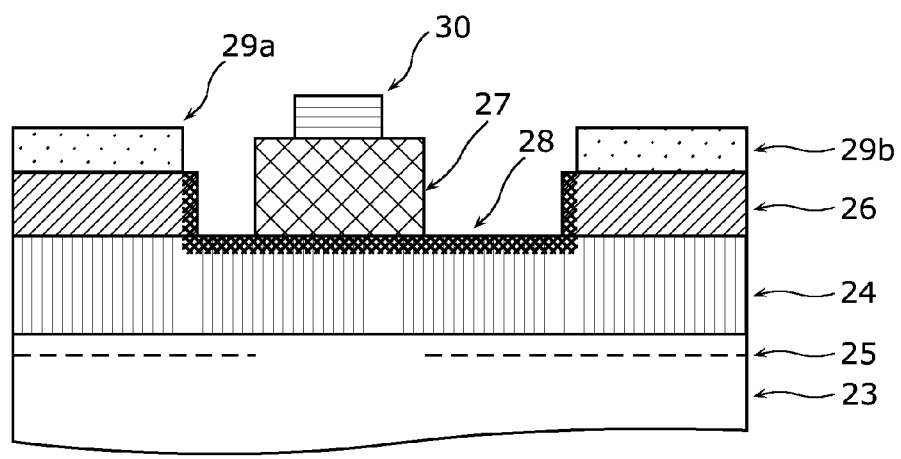
FIG. 4A is a schematic cross-sectional view illustrating an example of a structure of a nitride semiconductor device which achieves both normally-off operation and low contact resistance.
Figure 4B:
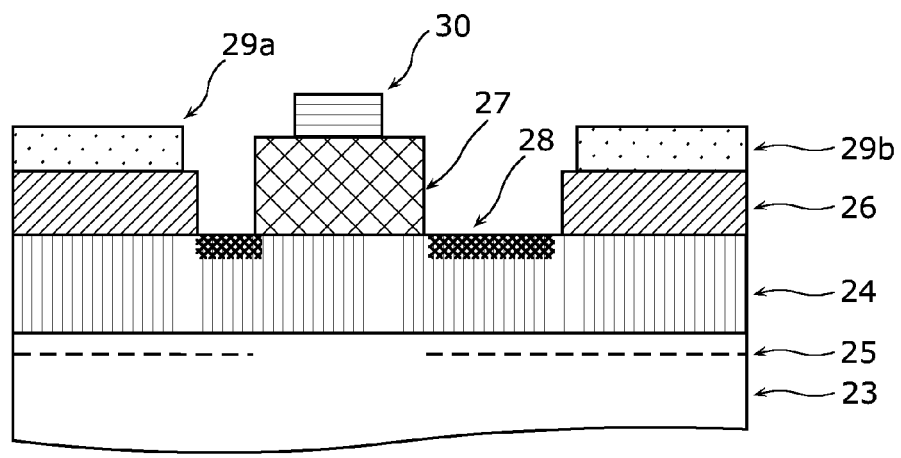
FIG. 4B is a schematic cross-sectional view illustrating an example of a structure of the nitride semiconductor device which achieves both normally-off operation and low contact resistance.

FIG. 4A and FIG. 4B each illustrates a cross-sectional structure of a nitride semiconductor device according to Embodiment 1 which achieves both low contact resistance and normally-off operation. In Embodiment 1, a description is given of group-III nitride semiconductors, but the present disclosure is not limited thereto.

FIG. 4A and FIG. 4B each illustrates a stacked structure which sequentially includes, from the bottom, a given substrate (for example, a substrate of Sic, Sapphire, Si or GaN, not illustrated), or a buffer layer (for example, a buffer layer comprising a combination of different group-III nitride semiconductors, such as AlN, AlGaN, GaN, and AlInGaN, not illustrated), a channel layer 23 (for example, a group-III nitride semiconductor such as GaN, InGaN, or AlInGaN), and a carrier supply layer 24 (for example, AlGaN or InAlGaN) including Al and having a band gap larger than that of the channel layer 23. On the channel layer 23 side at the interface between the channel layer 23 and the carrier supply layer 24, a two-dimensional electron gas layer (2DEG layer 25) that is a channel in which electrons can move fast is formed due to piezoelectricity and band gap difference.

The channel layer 23 is an example of a first nitride semiconductor layer formed above the substrate. The carrier supply layer 24 is an example of a second nitride semiconductor layer formed above the first nitride semiconductor layer and having a band gap larger than that of the first nitride semiconductor layer.

Furthermore, n-type capping layers 26 for achieving low contact resistance (for example, n-GaN, n-InGaN, or n-AlInGaN) are selectively formed. Between the n-type capping layers 26 selectively formed, a p-type capping layer 27 (for example, p-AlInGaN, p-InGaN, p-AlGaN, or p-GaN) doped with Mg or Zn and for achieving normally-off operation is selectively formed so as not to contact the n-type capping layers 26.

It may be that the n-type capping layers 26 are doped with impurities such as Si of at least $5 \times 10^{18}$ cm$^{-3}$ to form a low-resistance n-type capping layer. Furthermore, formation of the p-type capping layer 27 on the carrier supply layer 24 causes, due to a p-n junction, a depletion region in a portion of the 2DEG layer 25 near immediately below the p-type capping layer 27, resulting in a portion with no 2DEG layer 25. This allows normally-off operation.

The p-type capping layer 27 is an example of a p-type nitride semiconductor layer formed above a portion of the second nitride semiconductor layer. The n-type capping layers 26 are an example of two third n-type nitride semiconductor layers above the second nitride semiconductor layer and located separately on either side of the p-type nitride semiconductor layer.

When the p-type capping layer 27 is selectively formed, p-type impurities, such as Mg or Zn, are diffused from a p-type group-III nitride semiconductor layer that is before being selectively etched into the p-type capping layer 27, into a surface of the carrier supply layer 24 that is formed earlier and in contact with the p-type group-III nitride semiconductor layer and surfaces or side walls of the selectively formed n-type capping layers 26. As a result, a p-type or high-resistance diffusion layer 28 is formed.

For example, when the p-type impurities are Mg, the depth of diffusion is a few nm to 30 nm approximately, and the amount of diffused impurities is $5\times10^{17}$ cm$^{-3}$ to $5\times10^{18}$ cm$^{-3}$ approximately. Subsequently, a source electrode 29a and a drain electrode 29b are formed on the n-type capping layers 26 to form ohmic contacts. A gate electrode 30 is formed on the surface of the p-type capping layer 27 so as to form a Schottky contact or an ohmic contact.

The source electrode 29a and the drain electrode 29b may be arranged at any position as long as they are separately located on either side of the p-type capping layer 27. The source electrode 29a and the drain electrode 29b may contact any one of the channel layer 23, the carrier supply layer 24, and the n-type capping layer 26, or may be formed on the surface of the n-type capping layers 26. More specifically, at least the source electrode 29a or the drain electrode 29b may contact the capping layer 26, and may further contact the two-dimensional electron gas region formed in the upper region of the channel layer 23.

The source electrode 29a and the drain electrode 29b are, respectively, examples of a first ohmic electrode and a second ohmic electrode formed above the two third nitride semiconductor layers.

Furthermore, it may be that the p-type or high-resistance diffusion layer 28 in the surfaces of the n-type capping layers 26 is partially removed in the regions that are in contact with the source electrode 29a and the drain electrode 29b. Alternatively, it may be that the p-type impurity concentration in the surface of the n-type capping layers 26 is lower by $1\times10^{17}$ cm$^{-3}$ than that in the diffusion layer 28 in the surface layer of the carrier supply layer 24 in the region above which neither the p-type capping layer 27 nor the n-type capping layers 26 is formed.

Each of the source electrode 29a and the drain electrode 29b comprises an electrode including one metal or two or more metals selected from among Ti, Al, Mo, Hf and the like. The gate electrode 30 comprises an electrode including one metal or two or more metals selected from among Ti, Al, Ni, Pt, Pd, Au and the like. The gate electrode 30 is an example of a gate electrode above the p-type nitride semiconductor layer.

As described, in the structure according to Embodiment 1, a surface layer of the carrier supply layer 24 (second nitride semiconductor layer) in a region above which neither the p-type capping layer 27 (p-type nitride semiconductor layer) nor the n-type capping layers 26 (third nitride semiconductor layers) is formed includes p-type impurities identical to those included in the p-type capping layer 27 (p-type nitride semiconductor layer).

On the other hand, the n-type capping layers 26 (third nitride semiconductor layers) include a surface layer which does not include p-type impurities identical to those in the p-type capping layer 27 (p-type nitride semiconductor layer).

Furthermore, a relation of $(Y-X)>1\times10^{17}$ cm$^{-3}$ is satisfied where X represents the amount of p-type impurities in the surface layer of the n-type capping layers 26 (third nitride semiconductor layers) and Y represents the amount of p-type impurities in the surface layer of the carrier supply layer 24 (second nitride semiconductor layer) in a region above which neither the p-type capping layer 27 (p-type nitride semiconductor layer) nor the n-type capping layers 26 (third nitride semiconductor layers) is formed.

For example, the n-type capping layers 26 (third nitride semiconductor layers) may have an Al composition lower than that in the carrier supply layer 24 (second nitride semiconductor layer). Furthermore, the n-type capping layers 26 (third nitride semiconductor layers) may have a band gap smaller than that of the carrier supply layer 24 (second nitride semiconductor layer). Here, for example, the n-type capping layers 26 (third nitride semiconductor layers) may comprise $Al_xIn_yGa_zN$ (where $0 \le x, y, z \le 1$), or comprise Si of at least $5\times10^{18}$ cm$^{-3}$.

Next, FIG. 5A to FIG. 5G illustrate an example of a manufacturing method according to Embodiment 1. However, the elements of the manufacturing method described here are minimum necessary for implementing embodiments of the present disclosure, and are not limited thereto.

Figure 5A:
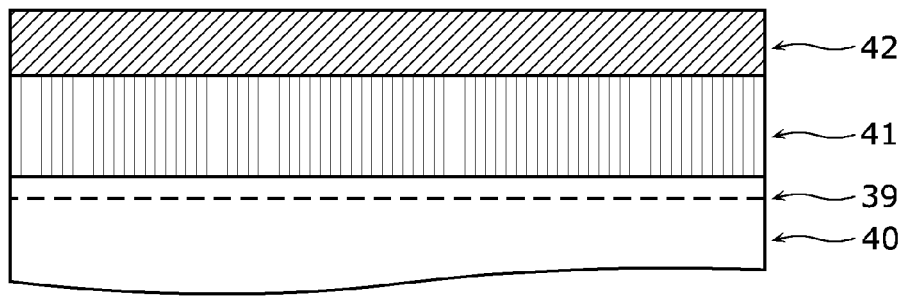
FIG. 5A is a schematic cross-sectional view for illustrating a method of manufacturing a nitride semiconductor device which achieves both normally-off operation and low contact resistance.

First, a buffer layer or the like (for example, a buffer layer comprising a combination of different group-III nitride semiconductors, such as AlN, AlGaN, GaN, InGaN, and AlInGaN, not illustrated) is grown on a substrate of Sapphire, Sic, Si, GaN, or the like (not illustrated) for epitaxial growth of group-III nitride semiconductors by a known epitaxy technique such as MOCVD. Subsequently, a channel layer 40 comprising a group-III nitride semiconductor (for example, GaN, InGaN, or AlInGaN) is grown. A carrier supply layer 41 is grown which has a band gap larger than that of the channel layer 40 and which comprises a group-III nitride semiconductor including Al (such as AlGaN or AlInGaN), and then an n-type group-III nitride semiconductor layer 42 (for example, n-GaN, n-InGaN, or n-AlInGaN) is further grown (FIG. 5A). The layers thus formed are referred to an epitaxial substrate. It may be that the n-type group-III nitride semiconductor layer 42 is doped with impurities such as Si of at least $5\times10^{18}$ cm$^{-3}$ so as to form a low-resistance n-type layer.

Due to piezoelectricity and band gap difference, a 2DEG layer 39 that is a channel where electrons can move fast is formed on the channel layer side 40 at the interface between the channel layer 40 and the carrier supply layer 41.

Figure 5B:
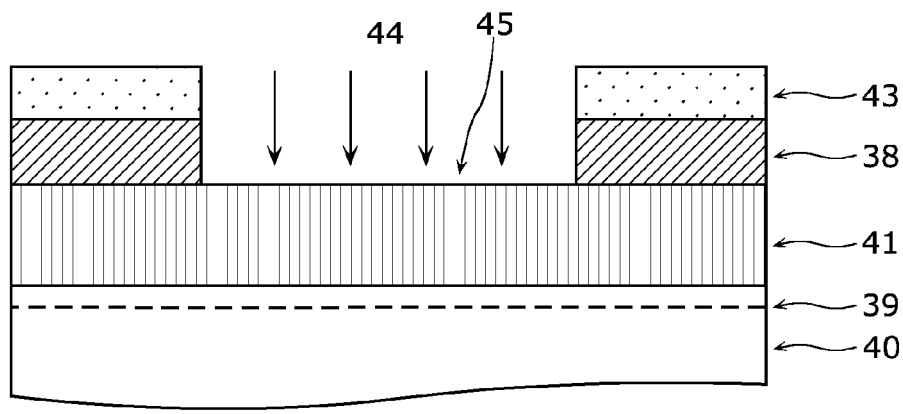
FIG. 5B is a schematic cross-sectional view for illustrating a method of manufacturing the nitride semiconductor device which achieves both normally-off operation and low contact resistance.

Next, a resist pattern 43 is formed by a known photolithography technique. A recessed portion 45 is formed by a know dry etching technique (for example, a reactive ion etching (RIE) or inductive coupled plasma-RIE (ICP-RIE)) which includes plasma 44 using etching gas such as $Cl_2$, $BCl_3$, $O_2$, Ar, or $N_2$. The n-type group-III nitride semiconductor layer 42 is selectively left, and thereby forming the n-type capping layers 38 (FIG. 5B).

It may be that the dry etching technique is a known selective etching, and that etching is stopped near the surface of the carrier supply layer 41. Furthermore, due to reaction with Al, selective etching of group-III nitride semiconductor is stopped or its etching rate decreases at a certain level of selectivity (for example, the etching rate of the n-type group-III nitride semiconductor layer 42 is twice or more as high as the etching rate of the carrier supply layer 41). Hence, it may be that the underlying carrier supply layer 41 has an Al composition higher than that of the n-type group-III nitride semiconductor layer 42 located above, or that the n-type group-III nitride semiconductor layer 42 includes no Al. Furthermore, for example, in the case where the carrier supply layer 41 comprises AlGaN with an Al composition of 25%, the critical thickness is 100 nm at most, and therefore, it may be that the carrier supply layer 41 is 100 nm at most.

Figure 5C:
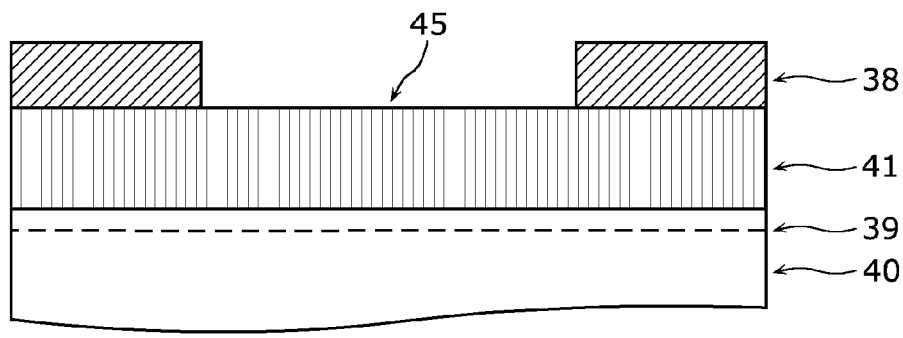
FIG. 5C is a schematic cross-sectional view for illustrating the method of manufacturing the nitride semiconductor device which achieves both normally-off operation and low contact resistance.

Next, the resist pattern 43 is removed by using a known organic solvent cleaning, acid cleaning or the like, to clean the surface of the epitaxial substrate (FIG. 5C).

Figure 5D:
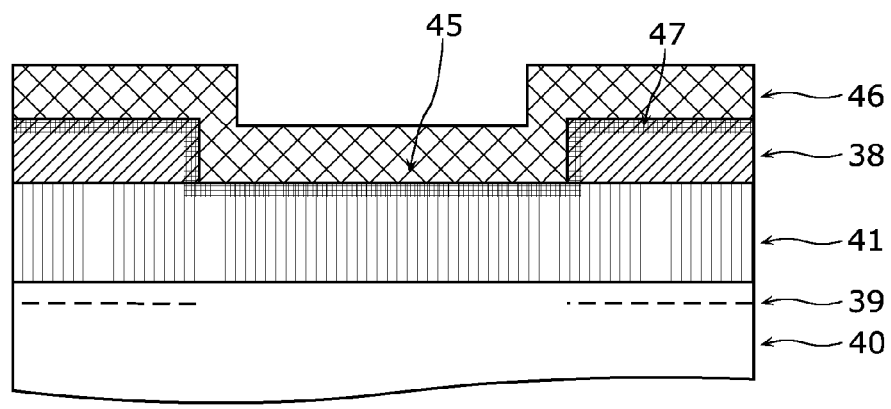
FIG. 5D is a schematic cross-sectional view for illustrating the method of manufacturing the nitride semiconductor device which achieves both normally-off operation and low contact resistance.

Next, the p-type group-III nitride semiconductor layer 46 is grown by a known epitaxy technique (for example, MOCVD) or the like so as to cover the n-type capping layers 38 and the carrier supply layer 41 (FIG. 5D). The p-type group-III nitride semiconductor layer 46 is a group-III nitride semiconductor layer doped with p-type impurities such as Mg or Zn, and may comprise p-AlInGaN, p-InGaN, p-AlGaN, p-GaN or the like. When growing the p-type group-III nitride semiconductor layer 46, the p-type impurities, such as Mg or Zn, in the p-type group-III nitride semiconductor layer 46 are diffused into the surface of the earlier formed carrier supply layer 41 and the surfaces or side walls of the selectively formed n-type capping layers 38, and thereby forming a p-type or high-resistance diffusion layer 47. For example, when the p-type impurities are Mg, the depth of diffusion is a few nm to 30 nm approximately, and the amount of diffused impurities is $5 \times 10^{17}$ cm$^{-3}$ to $5 \times 10^{18}$ cm$^{-3}$ approximately.

In the case where the p-type group-III nitride semiconductor layer 46 is a group-III nitride semiconductor layer, such as p-GaN, which does not include Al and the n-type capping layers 38 are not sufficiently thick, epitaxy of the group-III nitride semiconductor layer 46 by, for example, MOCVD, planarizes the n-type capping layers 38 which has been formed. In order to avoid this, the n-type capping layers 38 need to be sufficiently thicker than the p-type group-III nitride semiconductor layer 46, or the p-type group-III nitride semiconductor layer 46 needs to be grown under epitaxial conditions which do not cause such planarization. More specifically, since the general thickness of the p-type group-III nitride semiconductor layer 46 for normally-off operation is one hundred to several hundred nm, it may be that the n-type capping layers 38 have a thickness that is at least twice (200 nm or more) as great as that of the p-type group-III nitride semiconductor layer 46.

Formation of the p-type group-III nitride semiconductor layer 46 causes, due to a p-n junction, a depletion region in the 2DEG layer near immediately below the p-type group-III nitride semiconductor layer 46, and thereby forming a portion with no 2DEG layer 39.

Figure 5E:
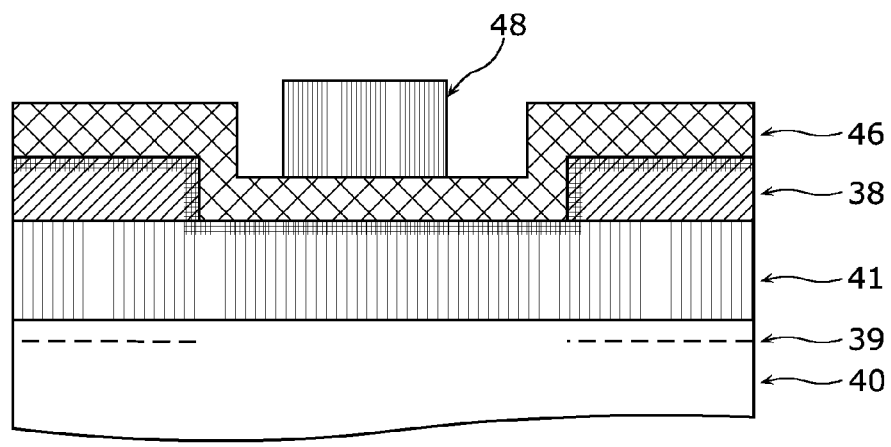
FIG. 5E is a schematic cross-sectional view for illustrating the method of manufacturing the nitride semiconductor device which achieves both normally-off operation and low contact resistance.

Next, a resist pattern 48 is formed by a known photolithography technique (FIG. 5E).

Figure 5F:
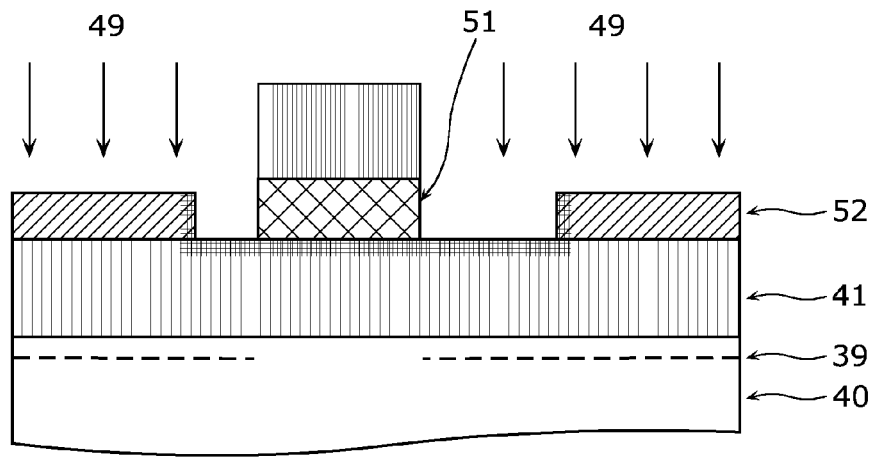
FIG. 5F is a schematic cross-sectional view for illustrating the method of manufacturing the nitride semiconductor device which achieves both normally-off operation and low contact resistance.

Next, the p-type group-III nitride semiconductor layer 46 is partially removed by a know dry etching technique (for example, RIE or ICP-RIE) which includes plasma 49 using etching gas, such as O$_2$, BCl$_3$, O$_2$, Ar, or N$_2$, and thereby forming a p-type capping layer 51 partially left (FIG. 5F). It may be that the dry etching technique is a known selective etching, and that etching is stopped near the surface of the carrier supply layer 41. Furthermore, due to reaction with Al, selective etching of group-III nitride semiconductor stops, or its etching rate decreases at a certain level of selectivity (for example, the etching rate of the p-type group-III nitride semiconductor layer 46 is twice or more as high as the etching rate of the carrier supply layer 41). Hence, it may be that the underlying carrier supply layer 41 has an Al composition higher than that of the p-type group-III nitride semiconductor layer 46 located above, or that the p-type group-III nitride semiconductor layer 46 includes no Al.

Furthermore, formation of the p-type capping layer 51 causes, due to a p-n junction, a depletion region in the 2DEG layer 39 near immediately below the p-type capping layer 51, and thereby forming a portion with no 2DEG layer 39. This allows normally-off operation.

The threshold voltage (Vth) of the nitride semiconductor device according to Embodiment 1 significantly depends on doping concentration of p-type impurities, composition and thickness of the carrier supply layer 41 and the p-type group-III nitride semiconductor layer 46 formed above. This requires close inspection of thickness, doping concentration, and composition of each layer.

If etching stops near the surface of the carrier supply layer 41 and then etching is further continued, the surfaces of the n-type capping layers 38 are also removed. Hence, etching needs to be stopped under a certain level of time control. When forming ohmic electrodes on the surfaces of the n-type capping layers 38 in a subsequent process, formation of the ohmic electrodes on the surface of the p-type or high-resistance diffusion layer 47 is likely to result in poor ohmic contacts. Hence, over-etching needs to be performed to the extent that the p-type or high-resistance diffusion layer 47 is removed (a few nm to 30 nm). Such over-etching removes the p-type or high-resistance diffusion layer 47 or forms the n-type capping layers 52 with reduced p-type impurities.

Figure 5G:
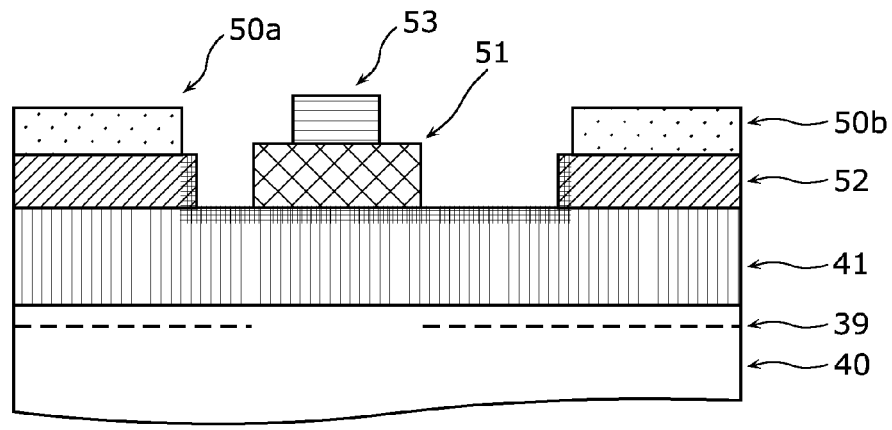
FIG. 5G is a schematic cross-sectional view for illustrating the method of manufacturing the nitride semiconductor device which achieves both normally-off operation and low contact resistance.

Next, the resist pattern 48 is removed by using a known organic solvent cleaning, acid cleaning or the like, to clean the surface of the epitaxial substrate. Subsequently, a source electrode 50a and a drain electrode 50b which form ohmic contacts are formed on the n-type capping layers 52 separately located on either side of the p-type capping layer 51, by a known photolithography, evaporation method, lift-off, annealing, or the like, and a gate electrode 53 is formed to form a Shottky contact or an ohmic contact on the surface of the p-type capping layer 51 (FIG. 5G). The source electrode 50a and the drain electrode 50b may be arranged at any position as long as they are separately located on either side of the p-type capping layer 51. The source electrode 50a and the drain electrode 50b may be formed by a known ohmic recess technique so as to contact any one of the channel layer 40, the carrier supply layer 41, and the n-type capping layers 52, or formed on the surface of the n-type capping layers 52. Furthermore, as described above, it may be that the p-type or high-resistance diffusion layer 47 on the surfaces of the n-type capping layers 52 is removed in regions which contact the source electrode 50a and the drain electrode 50b. Each of the source electrode 50a and the drain electrode 50b comprises an electrode including one metal or two or more metals selected from among Ti, Al, Mo, Hf, and the like. The gate electrode 53 comprises an electrode including one metal or two or more metals selected from among Ti, Al, Ni, Pt, Pd, Au, and the like.

As described above, the method of manufacturing a semiconductor device according to Embodiment 1 includes: preparing a substrate; forming a first nitride semiconductor layer above the substrate; stacking, above the first nitride semiconductor layer, a second nitride semiconductor layer having a band gap larger than a band gap of the first nitride semiconductor layer; stacking a third nitride semiconductor layer above the second nitride semiconductor layer; selectively removing a portion of the third nitride semiconductor layer to form a first capping layer comprising the third nitride semiconductor layer; stacking a p-type nitride semiconductor layer so as to cover the second nitride semiconductor layer and the first capping layer; selectively removing a portion of the p-type nitride semiconductor layer to form a second capping layer comprising the p-type nitride semiconductor layer; forming a first ohmic electrode and a second ohimc electrode above the first capping layer; and forming a gate electrode above the second capping layer.

Figure 6A:
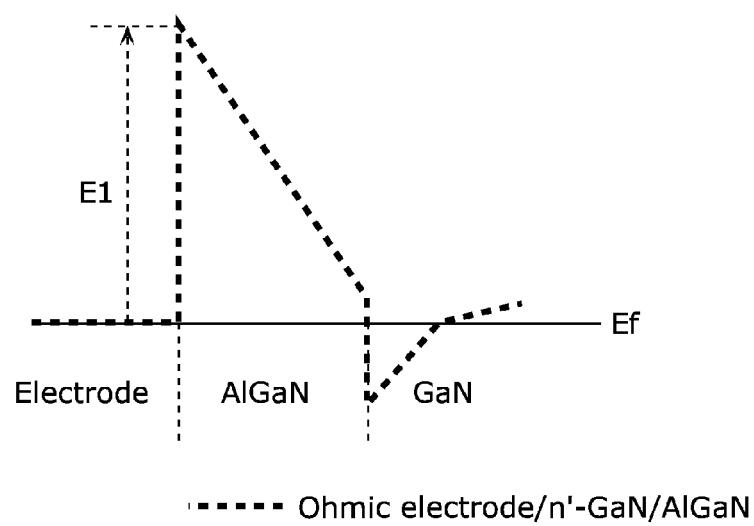
FIG. 6A is a schematic diagram illustrating a band structure of a conductor in a structure of ohmic electrode/AlGaN/GaN at zero bias.
Figure 6B:
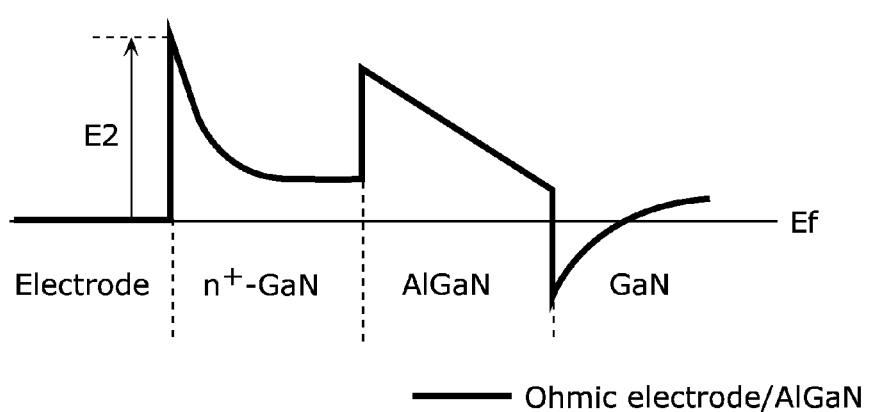
FIG. 6B is a schematic diagram illustrating a band structure of a conductor in a structure of ohmic electrode/n$^+$-GaN/AlGaN/GaN at zero bias.

Such a structure, in which the n-type capping layers 26 are located between (i) the carrier supply layer 24 and (ii) the source electrode 29a and the drain electrode 29b which are ohmic electrodes, changes the band structure, and thereby providing low contact resistance. The mechanism is illustrated in FIG. 6A and FIG. 6B. FIG. 6A is a band diagram of a conductor when an ohmic electrode contacts the AlGaN/GaN structure. FIG. 6B is a band diagram of a conductor when an ohmic electrode contacts the n$^+$-GaN/AlGaN/GaN structure. FIG. 6A and FIG. 6B each illustrates the state at zero bias. Ef represents a so-called Fermi level.

It is assumed in FIG. 6A and FIG. 6B that the upper direction indicates a higher energy level. Here, in the band structure illustrated in FIG. 6A, electrons in an ohmic electrode requires energy of level E1 to reach the 2DEG layer formed at the interface of AlGaN/GaN. In contrast, in the band structure in FIG. 6B, electrons in an ohmic electrode requires only energy of level E2 to reach the 2DEG layer formed at the interface of AlGaN/GaN passing through n$^+$-GaN. Compared to E1, E2 is only half approximately, and thereby reducing the contact resistance of the ohmic electrode.

More specifically, for example, in the case where the channel layer 23 is an undoped GaN, the carrier supply layer 24 is AlGaN having a thickness of 20 nm and an Al composition of 25%, and the n-type capping layers 26 comprising the n-type group-III nitride semiconductor layer is GaN doped with Si of at least $1 \times 10^{19}$ cm$^{-3}$, providing the n-type capping layers 26 of the n-type group-III nitride semiconductor layer can reduce the contact resistance from approximately 1.0 ohm-mm to at most 0.3 ohm-mm.

Furthermore, increasing the resistance of the semiconductor surface of the diffusion layer 28 where p-type impurities are diffused can reduce leakage current flowing from the gate electrode 30 to the drain electrode 29b and from the gate electrode 30 to the source electrode 29a passing through a portion near the semiconductor surface. In particular, in the case where the n-type capping layer 26 on the source electrode 29a side and the p-type capping layer 27 are formed close at the maximum limit of process margin in order to reduce source resistance, the diffusion layer 28 into which p-type impurities for increasing the resistance of the semiconductor surface are diffused is necessary for reducing gate to source leakage current.

The diffusion layer 28 for reducing leakage current from the gate electrode 30 to the drain electrode 29b or from the gate electrode 30 to the source electrode 29a may be at any position as long as the diffusion layer 28 is, as illustrated in FIG. 4A, in the surface layer of the carrier supply layer 24, between the source electrode 29a and the drain electrode 29b, and on the side walls of the n-type capping layers 26 closer to the p-type capping layer 27. As illustrated in FIG. 4B, the diffusion layer 29 may be in the surface layer of the carrier supply layer 24, between the gate electrode 30 and the source electrode 29a, and between the gate electrode 30 and the drain electrode 29b. In the case of FIG. 4B, the surface layer of the carrier supply layer 24, in regions above which neither the p-type capping layer 27 nor the n-type capping layers 26 is formed, includes p-type impurities included in the p-type capping layer 27.

Furthermore, since the diffusion layer 28 inhibits ohmic contacts of the source electrode 29a and the drain electrode 29b, it may be that almost no p-type impurities included in the diffusion layer 28 is present below the ohmic electrodes of the source electrode 29a and the drain electrode 29b, or that the p-type impurity concentration in the regions below the ohmic electrodes of the source electrode 29a and the drain electrode 29b is lower, by $1 \times 10^{17}$ cm$^{-3}$, than that in the diffusion layer 28 other than the regions below the ohmic electrodes.

Note that the term "upper" or "above" refers to a direction from the channel layer toward the gate electrode in each drawing, not only in Embodiment 1 but also in the other embodiments.

According to the above structure described above, a group-III nitride semiconductor device which achieves both low contact resistance and normally-off operation can be easily formed. In addition, a high-resistance layer into which Mg or the like is diffused below the ohmic electrodes can be removed, which leads to a structure where poor contacts are not likely to occur.

Embodiment 2

Figure 7A:
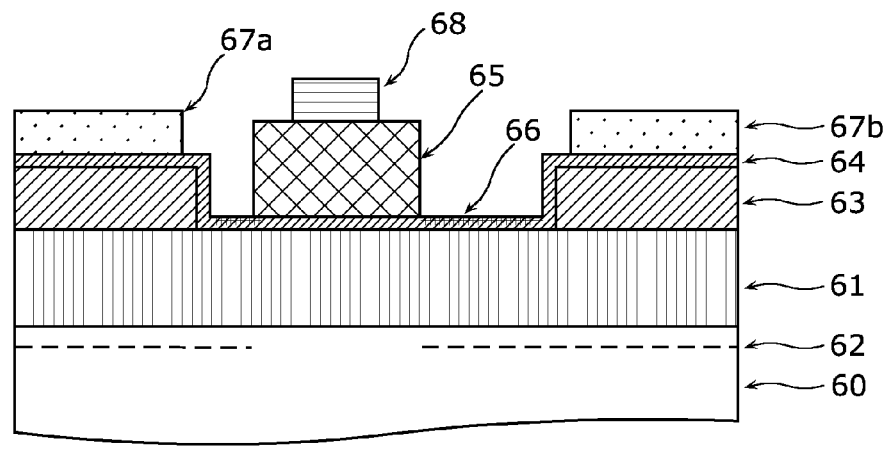
FIG. 7A is a schematic cross-sectional view illustrating an example of a structure of a nitride semiconductor device which includes an etching stopper layer and achieves both normally-off operation and low contact resistance.
Figure 7B:
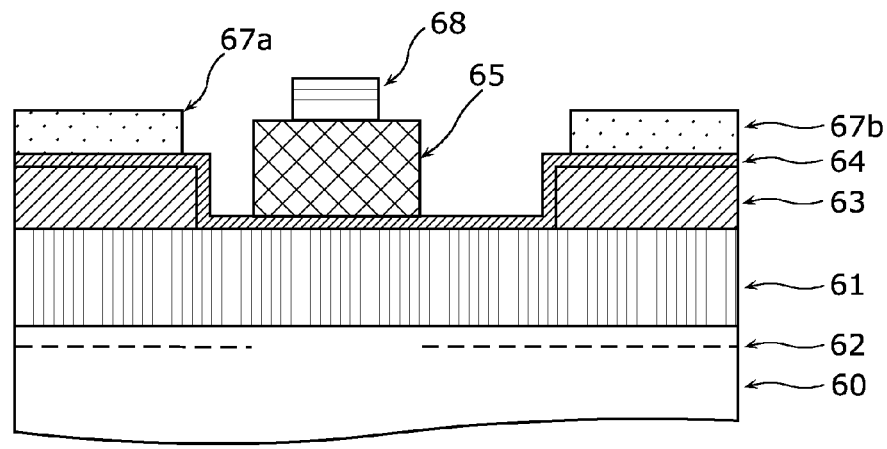
FIG. 7B is a schematic cross-sectional view illustrating an example of a structure of the nitride semiconductor device which includes an etching stopper layer and achieves both normally-off operation and low contact resistance.

FIG. 7A and FIG. 7B each illustrates a cross-sectional structure of a nitride semiconductor device according to Embodiment 2 which includes an etching stopper layer and achieves both low contact resistance and normally-off operation. In Embodiment 2, a description is given of group-III nitride semiconductors, but the present disclosure is not limited thereto.

FIG. 7A and FIG. 7B each illustrates a stacked structure sequentially including, from the bottom, a given substrate (for example, a substrate of SiC, Sapphire, Si or GaN, not illustrated), or a buffer layer (for example, a buffer layer comprising a combination of different group-III nitride semiconductors such as AlN, AlGaN, GaN, and AlInGaN, not illustrated), a channel layer 60 (for example, a group-III nitride semiconductor such as GaN, InGaN, or AlInGaN), and a carrier supply layer 61 comprising a semiconductor (for example, AlGaN or InAlGaN) which includes Al and has a band gap larger than that of the channel layer 60. A 2DEG layer 62 is formed, due to piezoelectricity and band gap difference, on the channel layer 60 side at the interface between the channel layer 60 and the carrier supply layer 61.

The channel layer 60 is an example of the first nitride semiconductor layer above the substrate. The carrier supply layer 61 is an example of the second nitride semiconductor layer above the first nitride semiconductor layer and having a band gap larger than that of the first nitride semiconductor layer.

Furthermore, n-type capping layers 63 (for example, n-GaN, n-InGaN, or n-AlInGaN) for achieving low contact resistance are selectively formed.

It may be that the n-type capping layers 63 are doped with impurities, such as Si, of at least $5 \times 10^{18}$ cm$^{-3}$ to form a low-resistance n-type capping layer.

Furthermore, an etching stopper layer 64 (for example, a group-III nitride semiconductor such as AlGaN or AlInGaN) is formed so as to cover the carrier supply layer 61 and the n-type capping layers 63. It may be that the etching stopper layer 64 is group-III nitride semiconductor including Al to selectively remove an epitaxial layer to be subsequently formed thereon. The etching stopper layer 64 is an example of a fourth nitride semiconductor layer.

In a region on the etching stopper layer 64 other than the selectively formed n-type capping layers 63, a p-type capping layer 65 doped with Mg or Zn (for example, p-AlInGaN, p-InGaN, P—AlGaN, or p-GaN) for normally-off operation is selectively formed. Formation of the p-type capping layer 65 on the etching stopper layer 64 causes a depletion region, due to a p-n junction, in the 2DEG layer 62 near immediately below the p-type capping layer 65, and thereby forming a portion with no 2DEG layer 62 (portion where the dashed line is discontinued in the drawing). As a result, normally-off operation is achieved.

The p-type capping layer 65 is an example of a p-type nitride semiconductor layer. The n-type capping layers 63 are an example of n-type third nitride semiconductor layers.

When the p-type capping layer 65 is selectively formed, p-type impurities, such as Mg or Zn, are diffused from a p-type group-III nitride semiconductor layer that is before being selectively etched into the p-type capping layer 65, into the earlier formed etching stopper layer 64 that is in contact with the p-type group-III nitride semiconductor layer and the selectively formed n-type capping layers 63 or the carrier supply layer 61. As a result, a p-type or high-resistance diffusion layer 66 is formed.

For example, when the p-type impurities are Mg, the distance of diffusion of the p-type impurities is a few nm to 30 nm approximately, and the amount of diffused impurities is approximately $5 \times 10^{17}$ cm$^{-3}$ to $5 \times 10^{18}$ cm$^{-3}$. Accordingly, the region in which the diffusion layer 66 is formed by the diffusion of the p-type impurities is determined by the relationship between the level of diffusion of the p-type impurities and the thickness of the etching stopper layer 64. More specifically, there are three cases where (a) the diffusion layer 66 is only in the surface layer of the etching stopper layer 64, (b) the diffusion layer 66 is across the etching stopper layer 64, but does not reach the n-type capping layer 63 or the carrier supply layer 61, and (c) the diffusion layer 66 is across the etching stopper layer 64, and reaches the n-type capping layers 63 or the top layer of the carrier supply layer 61. FIG. 7A illustrates the case of (a).

A source electrode 67a and a drain electrode 67b which form ohmic contacts are formed on the surface of the etching stopper layer 64 above the n-type capping layers 63. A gate electrode 68 is formed so as to form a Schottky contact or an ohmic contact on the surface of the p-type capping layer 65.

The source electrode 67a and the drain electrode 67b may be arranged at any position as long as they are separately arranged on either side of the p-type capping layer 65. The source electrode 67a and the drain electrode 67b may be formed by a known ohmic recess technique so as to contact any one of the channel layer 60, the carrier supply layer 61, the n-type capping layers 63, and the etching stopper layer 64. The source electrode 67a and the drain electrode 67b may be formed on the surface of the etching stopper layer 64.

It may be that the p-type or high-resistance diffusion layer 66 in the surface of the etching stopper layer 64 or the n-type capping layers 63 (a few nm to 30 nm approximately from the surface) is partially removed in the regions which contact the source electrode 67a and the drain electrode 67b. Alternatively, it may be that the p-type impurity concentration in the etching stopper layer 64 and the p-type impurity concentration in the surfaces of the n-type capping layers are lower, by at least $1 \times 10^{17}$ cm$^{-3}$, than that in the surface layer of the etching stopper layer 64 on the carrier supply layer 61 in the region above which neither the p-type capping layer 65 nor the n-type capping layers 63 is formed.

Each of the source electrode 67a and the drain electrode 67b comprises an electrode including one metal or two or more metals selected from among Ti, Al, Mo, Hf and the like. The gate electrode 68 comprises an electrode including one metal or two or more metals selected from among Ti, Al, Ni, Pt, Pd, Au and the like. The source electrode 67a and the drain electrode 67b are examples of the first ohmic electrode and the second ohmic electrode, respectively.

As described, in the structure according to Embodiment 2, in a similar manner to Embodiment 1, a surface layer of the etching stopper layer 64 on the carrier supply layer 61 (second nitride semiconductor layer), in a region above which neither the p-type capping layer 65 (p-type nitride semiconductor layer) nor the n-type capping layers 63 (third nitride semiconductor layers) is formed, includes p-type impurities identical to the p-type impurities in the p-type capping layer 65 (p-type nitride semiconductor layer).

On the other hand, the n-type capping layers 63 (third nitride semiconductor layer) include surface layers which do not include p-type impurities identical to the p-type impurities in the p-type capping layer 65 (p-type nitride semiconductor layer).

Furthermore, a relation of $(Y-X) > 1 \times 10^{17}$ cm$^{-3}$ is satisfied where X represents the amount of p-type impurities in the surface layers of the n-type capping layers 63 (third nitride semiconductor layers) and Y represents the amount of p-type impurities in the carrier supply layer 61 (second nitride semiconductor layer) in the region above which neither the p-type capping layer 65 (p-type nitride semiconductor layer) nor the n-type capping layer 63s (third nitride semiconductor layers) is formed.

Furthermore, as illustrated in FIG. 7A, the fourth nitride semiconductor layer (the etching stopper layer 64) is located between the source electrode 67a (first ohmic electrode) and the n-type capping layer 63 (third nitride semiconductor layer), between the drain electrode 67b (second ohmic electrode) and the n-type capping layer 63 (third nitride semiconductor layer), and between the carrier supply layer 61 (second nitride semiconductor layer) and the p-type capping layer 65 (p-type nitride semiconductor layer), and has a material composition inactive to the etching gas used for the p-type capping layer 65.

Furthermore, as illustrated in FIG. 7B, for example, the fourth nitride semiconductor layer (etching stopper layer 64) covers the side walls of the n-type capping layers 63 (third nitride semiconductor layers).

For example, it may be that the n-type capping layers 63 (third nitride semiconductor layers) has an Al composition lower than that of the carrier supply layer 61 (second nitride semiconductor layer). Furthermore, the n-type capping layers 63 (third nitride semiconductor layer) may have a band gap smaller than that of the carrier supply layer 61 (second nitride semiconductor layer). Here, for example, the n-type capping layers 63 (third nitride semiconductor layers) may comprise Al$_x$In$_y$Ga$_z$N (where 0≤x, y, z≤1), or comprise Si of at least $5 \times 10^{18}$ cm$^{-3}$.

Figure 8A:
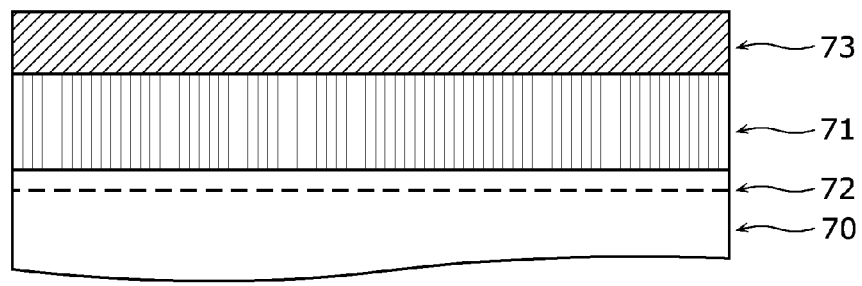
FIG. 8A is a schematic cross-sectional view for illustrating a method of manufacturing a nitride semiconductor device which includes an etching stopper layer and achieves both normally-off operation and low contact resistance.
Figure 8B:
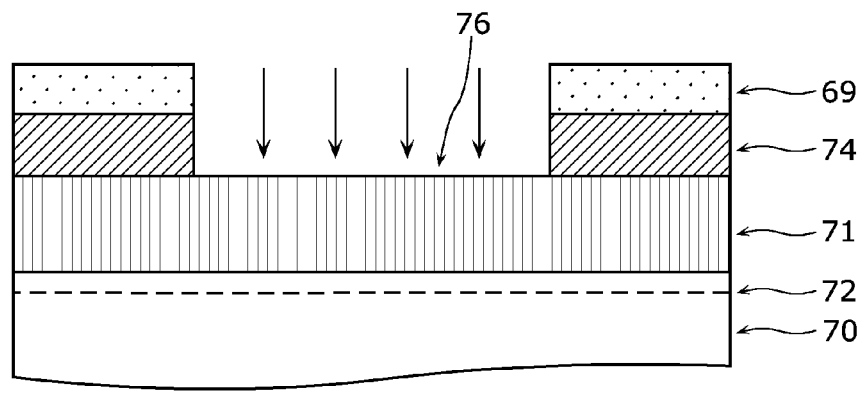
FIG. 8B is a schematic cross-sectional view for illustrating the method of manufacturing the nitride semiconductor device which includes an etching stopper layer and achieves both normally-off operation and low contact resistance.
Figure 8C:
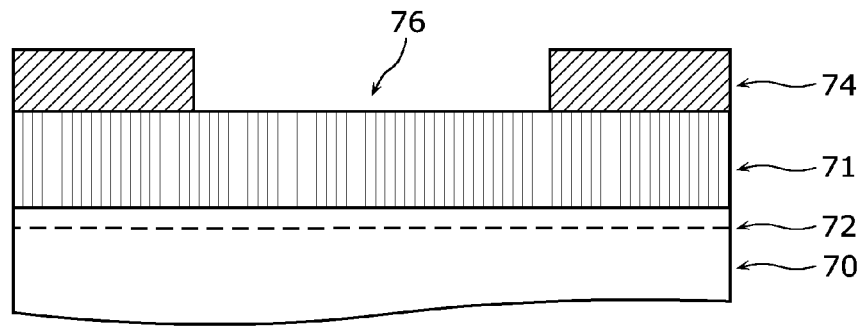
FIG. 8C is a schematic cross-sectional view for illustrating the method of manufacturing the nitride semiconductor device which includes an etching stopper layer and achieves both normally-off operation and low contact resistance.
Figure 8D:
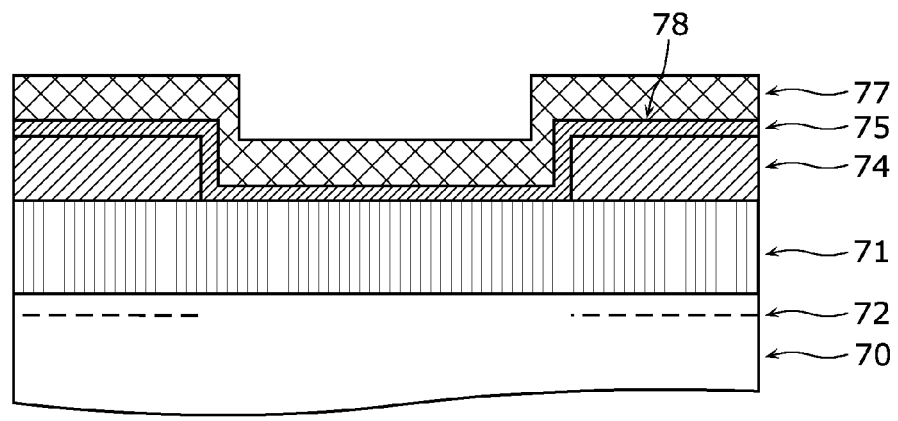
FIG. 8D is a schematic cross-sectional view for illustrating the method of manufacturing the nitride semiconductor device which includes an etching stopper layer and achieves both normally-off operation and low contact resistance.

FIG. 8A to FIG. 8G illustrate an example of a manufacturing method according to Embodiment 2. However, the elements of the manufacturing method described here are minimum necessary for implementing embodiments of the present disclosure and are not limited thereto. Respective steps illustrated in FIG. 8A to FIG. 8C are substantially the same as those in the manufacturing method according to Embodiment 1 illustrated in FIG. 5A to FIG. 5C, and thus, their descriptions are omitted.

Next, relative to the structure illustrated in FIG. 8C, an etching stopper layer 75 (for example, a group-III nitride semiconductor such as AlGaN or AlInGaN) and a p-type group-III nitride semiconductor layer 77 are grown by a known epitaxy technique (for example, MOCVD) so as to cover the exposed surfaces of the n-type capping layers 74 and the carrier supply layer 71.

The p-type group-III nitride semiconductor layer 77 is a group-III nitride semiconductor layer doped with p-type impurities, such as Mg or Zn, and for example, may comprise p-AlInGaN, p-InGaN, p-AlGaN, or p-GaN. When the p-type group-III nitride semiconductor layer 77 is grown, the p-type impurities, such as Mg or Zn, are diffused from the p-type group-III nitride semiconductor layer 77 into the earlier formed etching stopper layer 75 or the selectively formed n-type capping layers 74, and thereby forming a p-type or a high-resistance diffusion layer 78. When the p-type impurities are Mg, the depth of diffusion is a few nm to 30 nm approximately, and the amount of diffused impurities is approximately $5 \times 10^{17}$ cm$^{-3}$ to $5 \times 10^{18}$ cm$^{-3}$.

The epitaxy for forming the etching stopper layer 75 may be performed such that unevenness of the surface need not be planarized as long as the etching stopper layer 75 is evenly grown. This is because the etching stopper layer 75 needs to etch stop the p-type group-III nitride semiconductor layer 77 formed thereon. In contrast, since the p-type group-III nitride semiconductor layer 77 is selectively removed, the p-type group-III nitride semiconductor layer 77 may be epitaxially grown in such a manner that the surface is planarized or the p-type group-III nitride semiconductor layer 77 is evenly grown. Formation of the p-type group-III nitride semiconductor layer 77 causes, due to a p-n junction, a depletion region in the 2DEG layer 72 near immediately below the p-type group-III nitride semiconductor layer 77, and thereby forming a portion with no 2DEG layer 72.

The threshold voltage (Vth) of the semiconductor device according to Embodiment 2 significantly depends on the thickness and composition of the carrier supply layer 71, the thickness and composition of the etching stopper layer 75, and the doping concentration of p-type impurities, thickness, and composition of the p-type group-III nitride semiconductor layer 77 formed thereon. This requires close inspection of the thickness, doping concentration, and composition of each layer.

Furthermore, the etching stopper layer 75 also covers the side walls of the n-type capping layers 74. This prevents only the side walls of the n-type capping layers 74 from being etched in the selective removal of the p-type group-III nitride semiconductor layer 77 that is to be described later. In general, in a group-III nitride semiconductor device, SiN, $SiO_2$, $Al_2O_3$ or the like is used as a surface protective layer in view of surface protection, and reduction in surface level and current collapse.

If no etching stopper layer 75 is present and the side walls of the n-type capping layers 74 are etched and dent, voids might occur between the surface protective film, such as SiN, $SiO_2$ or $Al_2O_3$, and the side walls of the n-type capping layers 74. Occurrence of such voids at the side walls of the n-type capping layers 74 results in the nitride semiconductor surface being partially unprotected, which causes electron traps in the surface level and can cause current collapse. Hence, it is very important that the etching stopper layer 75 covers the side walls of the n-type capping layer 74.

Figure 8E:
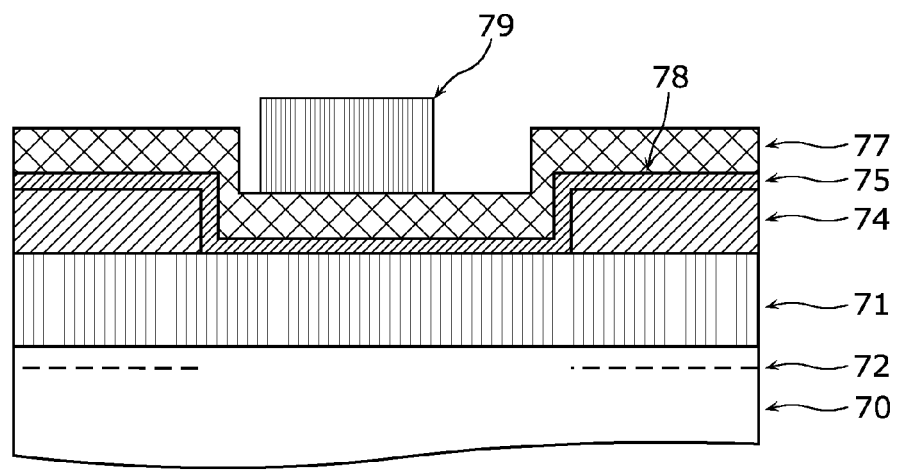
FIG. 8E is a schematic cross-sectional view for illustrating the method of manufacturing the nitride semiconductor device which includes an etching stopper layer and achieves both normally-off operation and low contact resistance.

Next, a resist pattern 79 is formed by a known photolithography technique (FIG. 8E).

Figure 8F:
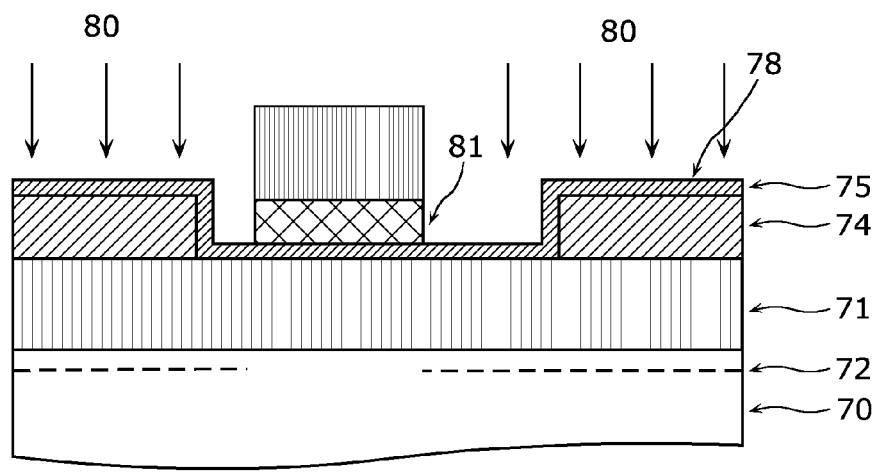
FIG. 8F is a schematic cross-sectional view for illustrating the method of manufacturing the nitride semiconductor device which includes an etching stopper layer and achieves both normally-off operation and low contact resistance.

Next, the p-type group-III nitride semiconductor layer 77 is partially removed by a known dry etching technique (for example, RIE or ICP-RIE) which includes plasma 80 using etching gas, such as $Cl_2$, $BCl_3$, $O_2$, Ar, or $N_2$, and a p-type capping layer 81 partially left is formed (FIG. 8F). It may be that the dry etching technique is a known selective etching, and that etching is stopped near the surface of the etching stopper layer 75. Furthermore, due to reaction with Al, selective etching of a group-III nitride semiconductor layer stops or its etching rate decreases at a certain level of selectivity (for example, the etching rate of the p-type group-III nitride semiconductor layer 77 is twice or more as high as the etching rate of the etching stopper layer 75). Hence, it may be that the underlying etching stopper layer 75 has an Al composition higher than that of the p-type group-III nitride semiconductor layer 77 above, or that the p-type group-III nitride semiconductor layer 77 includes no Al. Furthermore, formation of the p-type capping layer 81 causes, due to a p-n junction, a depletion region in the 2DEG layer 72 near immediately below the p-type capping layer 81, and thereby forming a portion with no 2DEG layer 72. As a result, normally off operation is possible.

Figure 8G:
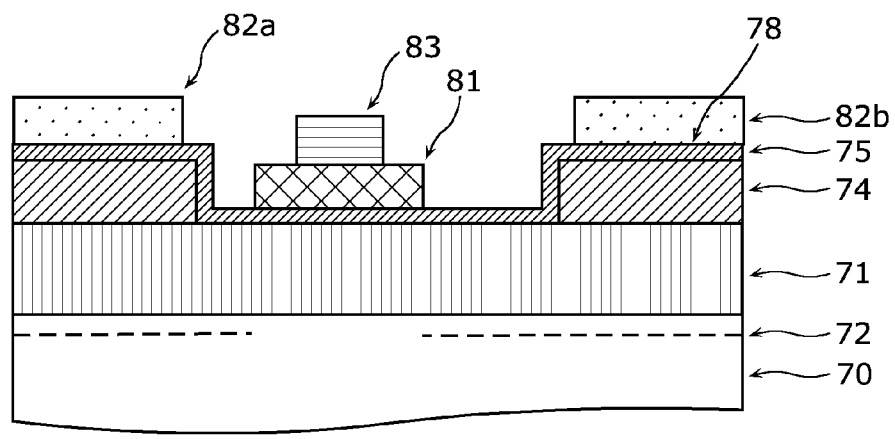
FIG. 8G is a schematic cross-sectional view for illustrating the method of manufacturing the nitride semiconductor device which includes an etching stopper layer and achieves both normally-off operation and low contact resistance.

Furthermore, the etching stopper layer 75 is formed which has a material composition inactive to an etching gas used for etching the p-type group-III nitride semiconductor layer 77. Hence, over-etch after completely removing a portion of the p-type group-III nitride semiconductor layer 77 does not result in removal of the n-type capping layers 74. In such a manner, compared to Embodiment 1, the manufacturing method according to Embodiment 2 further facilitates manufacturing of a semiconductor device having excellent reproducibility and surface distribution of contact resistance Next, the resist pattern 79 is removed by using a known organic solvent cleaning, acid cleaning or the like, to clean the surface of the epitaxial substrate. Subsequently, a source electrode 82a and a drain electrode 82b which form ohmic contacts are formed on the etching stopper layer 75 above the n-type capping layers 74 on both sides of the p-type capping layer 81, by a known photolithography, evaporation method, lift-off, annealing, or the like. A gate electrode 83 which forms a Shottky contact or an ohmic contact is formed on the surface of the p-type capping layer 81 (FIG. 8G).

The source electrode 82a and the drain electrode 82b may be arranged at any other positions as long as these electrodes are located separately on either side of the p-type capping layer 81. The source electrode 82a and the drain electrode 82b may be formed by a know ohmic recess technique so as to contact any one of the channel layer 70, the carrier supply layer 71, the n-type capping layer 74, and the etching stopper layer 75, or may be formed on the surface of the etching stopper layer 75. Each of the source electrode 82a and the drain electrode 82b comprises an electrode including one metal or two or more metals selected from among Ti, Al, Mo, Hf and the like. The gate electrode 83 comprises an electrode including one metal or two or more metals selected from among Ti, Al, Ni, Pt, Pd, Au and the like.

Figure 9A:
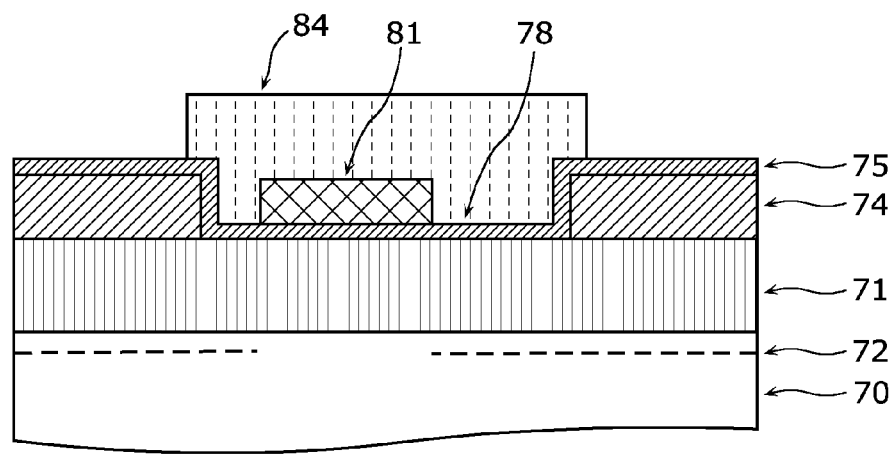
FIG. 9A is a schematic cross-sectional view for illustrating a method of manufacturing a nitride semiconductor device which partially includes an etching stopper layer and achieves both normally-off operation and low contact resistance.

Formation of an ohmic electrode on the surface of the etching stopper layer 75 results in formation of an ohmic electrode on the surface of the p-type or high-resistance diffusion layer 78. Hence, it may be that the p-type or high-resistance diffusion layer 78 is removed by a few nm to 30 nm approximately. FIG. 9A to FIG. 9D illustrate a method of manufacturing a normally-off nitride semiconductor device having low contact resistance and having a partially removed etching stopper layer. The structure illustrated in FIG. 9A is manufactured by the manufacturing method illustrated in FIG. 8A to FIG. 8F, and thus, its description and illustration are omitted.

Relative to the structure illustrated in FIG. 8F, the resist pattern 79 is removed by using a known organic solvent cleaning, acid cleaning or the like, to clean the surface of the epitaxial substrate. Next, a resist pattern 84 is formed by a known photolithography technique (FIG. 9A).

Figure 9B:
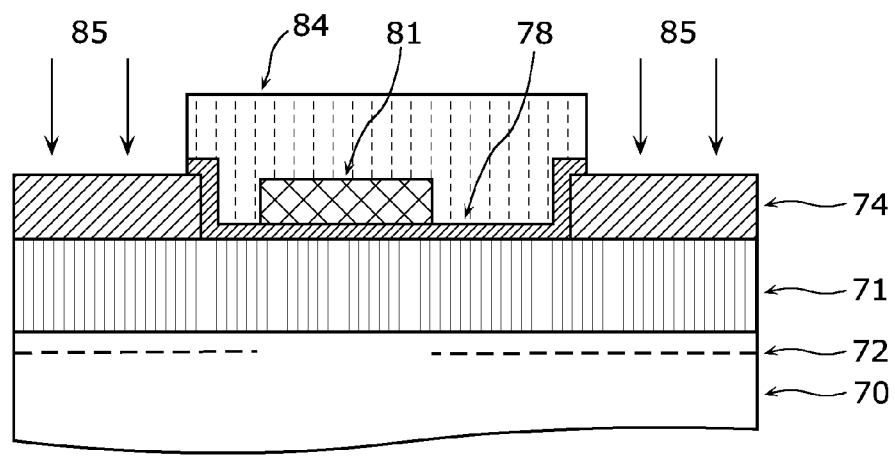
FIG. 9B is a schematic cross-sectional view for illustrating the method of manufacturing the nitride semiconductor device which partially includes an etching stopper layer and achieves both normally-off operation and low contact resistance.

Next, the etching stopper layer 75 and the n-type capping layers 74 are partially removed by a know dry etching technique (for example, RIE or ICP-RIE) which includes plasma 85 using etching gas such as $Cl_2$, $BCl_3$, $O_2$, Ar, or $N_2$ (FIG. 9B). Next, the resist pattern 84 is removed by using a known organic solvent cleaning, acid cleaning or the like, to clean the surface of the epitaxial substrate.

Figure 9C:
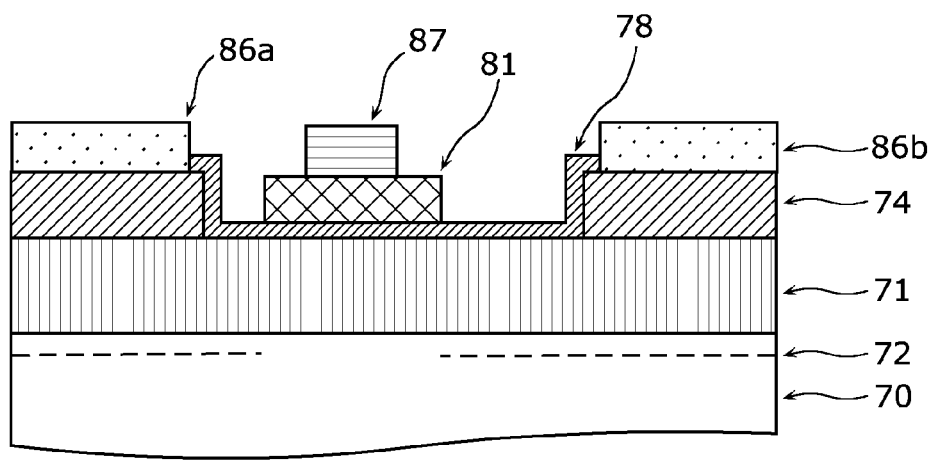
FIG. 9C is a schematic cross-sectional view for illustrating the method of manufacturing the nitride semiconductor device which partially includes an etching stopper layer and achieves both normally-off operation and low contact resistance.

Subsequently, a source electrode 86a and a drain electrode 86b which form ohmic contacts are formed on the n-type capping layers 74 separately located on either side of the p-type capping layer 81 by a known photolithography, evaporation method, lift-off, annealing, or the like. A gate electrode 87 which forms a Shottky contact or an ohmic contact is formed on the surface of the p-type capping layer 81 (FIG. 9C).

Each of the source electrode 86a and the drain electrode 86b comprises an electrode including one metal or two or more metals selected from among Ti, Al, Mo, Hf and the like. The gate electrode 87 comprises an electrode including one metal or two or more metals selected from among Ti, Al, Ni, Pt, Pd, Au and the like.

As described above, the method of manufacturing a semiconductor according to Embodiment 2 includes: preparing a substrate; forming a first nitride semiconductor layer above the substrate; stacking, above the first nitride semiconductor layer, a second nitride semiconductor layer having a band gap larger than a band gap of the first nitride semiconductor layer; stacking a third nitride semiconductor layer above the second nitride semiconductor layer; selectively removing a portion of the third nitride semiconductor layer to form a first capping layer comprising the third nitride semiconductor layer; stacking an etching stopper layer comprising a fourth nitride semiconductor layer and a p-type nitride semiconductor layer so as to cover the second nitride semiconductor layer and the first capping layer; selectively removing a portion of the p-type nitride semiconductor layer above the etching stopper layer to form a second capping layer comprising the p-type nitride semiconductor layer; forming a first ohmic electrode and a second ohimc electrode above the etching stopper layer located above the first capping layer and; and forming a gate electrode above the second capping layer.

Figure 9D:
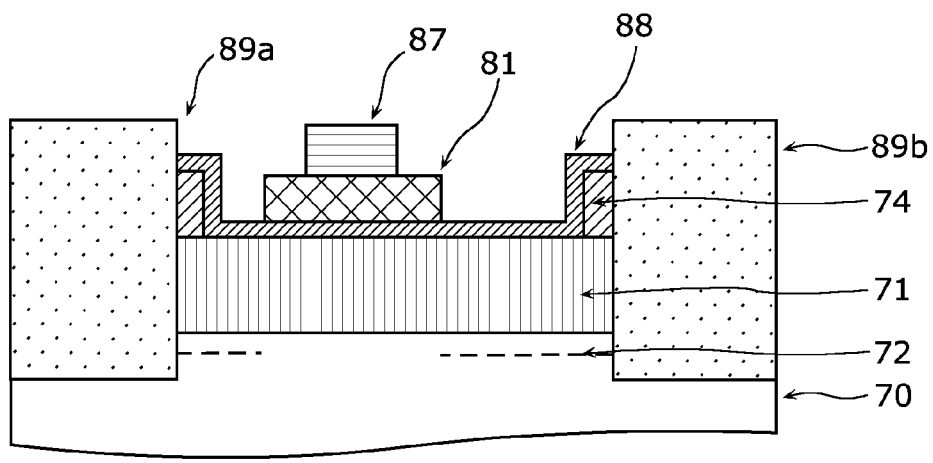
FIG. 9D is a schematic cross-sectional view for illustrating the method of manufacturing the nitride semiconductor device which partially includes an etching stopper layer and achieves both normally-off operation and low contact resistance.

As described above, etching by plasma 85 in the above process may reach any one of the etching stopper layer 75, the n-type capping layer 74, the carrier supply layer 71, and the channel layer 70 by a known ohmic recess technique. An example is illustrated in FIG. 9D where the source electrode 86a and the drain electrode 86b contact all the layers. In FIG. 9D, a source electrode 89a and a drain electrode 89b contact all of the etching stopper layer 75, the n-type capping layer 74, the carrier supply layer 71 and the channel layer 70. Accordingly, the source electrode 89a and the drain electrode 89b directly contact the 2DEG layer 72, which allows further reduction in contact resistance.

In Embodiment 1, the thickness of the n-type capping layers 63 is reduced by dry etching performed for forming the p-type capping layer 65. The structure illustrated in FIG. 7B according to Embodiment 2 does not cause such a reduction, which leads to excellent reproducibility and surface distribution of contact resistance. Since the etching stopper layer 64 in the above structure covers the side walls of the n-type capping layers 63 as well, the side walls of the n-type capping layers 63 is prevented from being etched when forming the p-type capping layer 65. In general, in a group-III nitride semiconductor device, SiN, $SiO_2$, $Al_2O_3$ or the like is used as a surface protective layer in view of surface protection and reduction in surface level and current collapse. If no etching stopper layer 64 is present and the side walls of the n-type capping layers 63 is etched and dent, voids might occur between the surface protective film such as SiN, $SiO_2$ or $Al_2O_3$ and the side walls of the n-type capping layers 63. Occurrence of such voids on the side walls of the n-type capping layers 63 results in the nitride semiconductor surface being partially unprotected, which causes electron traps in the surface level and can cause current collapse. Hence, it is very important that the etching stopper layer 64 covers the side walls of the n-type capping layers 63.

Such a structure in which the etching stopper layer 64 and the n-type capping layers 63 are provided between the carrier supply layer 61 and the source electrode 67 and the drain electrode 67b which are ohmic electrodes changes the band structure, thereby providing low contact resistance. The mechanism is illustrated in FIG. 10.

Figure 10:
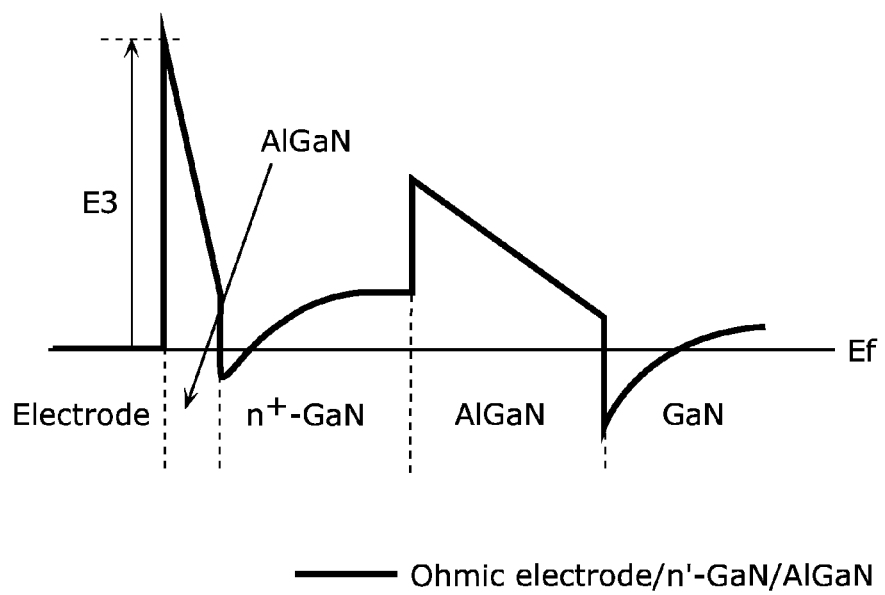
FIG. 10 is a schematic diagram illustrating a band structure of a conductor in a structure of ohmic electrode/AlGaWn$^+$-GaN/AlGaN/GaN at zero bias.

FIG. 10 is a band diagram of a conductor when an ohmic electrode contacts a thin AlGaN/$n^+$-GaN/AlGaN/GaN structure at zero bias. Ef represents a so-called Fermi level.

It is assumed in FIG. 10 that the upper direction indicates a higher energy level. Here, in the band structure illustrated in FIG. 10, electrons in an ohmic electrode requires energy of level E3 to reach the 2DEG layer formed at the interface of AlGaN/GaN. This is the energy at the same level as that in the AlGaN/GaN structure illustrated in FIG. 6A. At first view, contact resistance looks high, but the AlGaN layer, that is an etching stopper layer, with sufficiently reduced thickness (for example, up to 10 nm approximately) actually allows electrons to pass through along a path via the surface and deeper levels. Hence, electrons reach the 2DEG layer formed at the interface of AlGaN/GaN at the energy substantially equal to the energy level of E2 illustrated in FIG. 6B, and thereby reducing the contact resistance of an ohmic electrode.

More specifically, for example, the channel layer 60 is an undoped GaN, the carrier supply layer 61 is AlGaN having a thickness of 20 nm and an Al composition of 25%, and the capping layers 63 of the n-type group-III nitride semiconductor layer is GaN doped with Si of at least $1 \times 10^{19}$ cm$^{-3}$, and the etching stopper layer 64 is AlGaN having a thickness of 5 nm and an Al composition of 25%. In this case, providing the capping layers 63 of n-type group-III nitride semiconductor layer and the etching stopper layer 64 can reduce the contact resistance from approximately 1.0 ohm-mm to at most 0.3 ohm-mm.

Furthermore, increasing the resistance of the semiconductor surface of the diffusion layer 66 where p-type impurities are diffused can reduce leakage current flowing from the gate electrode 68 to the drain electrode 67b and from the gate electrode 68 to the source electrode 67a passing through a portion near the semiconductor surface. In particular, in the case where the n-type capping layer 63 on the source electrode 67a side and the p-type capping layer 65 are formed close at the maximum limit of process margin in order to reduce source resistance, the diffusion layer 66, into which p-type impurities that increases the semiconductor surface are diffused, is necessary for reducing leakage current between gate and source.

The diffusion layer 66 for reducing leakage current from the gate electrode 68 to the drain electrode 67b and from the gate electrode 68 to the source electrode 67a may be located, as illustrated in FIG. 7A, in portions of the surface layer of the etching stopper layer 64 between the gate electrode 68 and the source electrode 67a and between the gate electrode 68 and the drain electrode 67b. Although not illustrated in the drawing, the diffusion layer 66 may be in the entire surface of the etching stopper layer 64 covering the n-type capping layers 63 and the carrier supply layer 61.

According to the above structure, a group-III nitride semiconductor device which achieves both low contact resistance and normally-off operation can be easily formed, and a high-resistance layer into which Mg or the like is diffused can be removed in portions below the ohmic electrodes. This leads to a structure which is unlikely to cause poor contacts and which has excellent reproducibility and surface distribution of good contact resistance.

Embodiment 3

Figure 11:
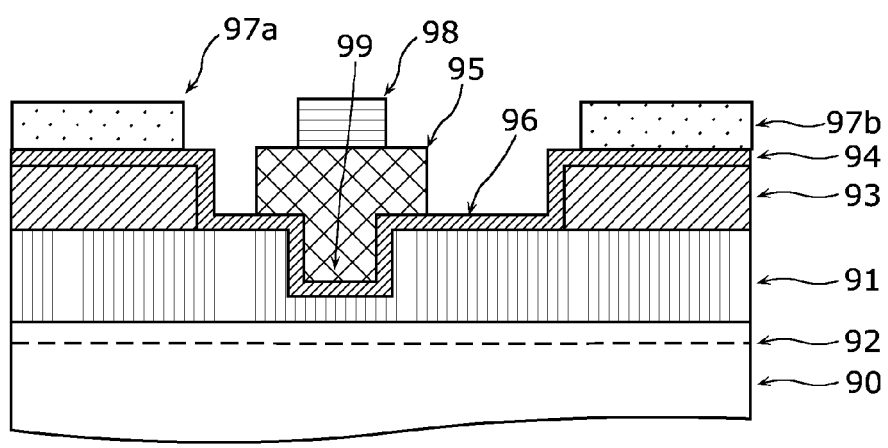
FIG. 11 is a schematic cross-sectional view illustrating an example of a structure of a recessed gate nitride semiconductor device which includes an etching stopper layer and achieves both normally-off operation and low contact resistance.

FIG. 11 illustrates a cross-sectional structure of a recessed gate nitride semiconductor device according to Embodiment 3 which includes an etching stopper layer and achieves both low contact resistance and normally-off operation. In Embodiment 3, a description is given of group-III nitride semiconductors, but the present disclosure is not limited thereto.

FIG. 11 illustrates a stacked structure which sequentially includes, from the bottom, a given substrate (for example, a substrate of Sic, Sapphire, Si or GaN, not illustrated), or a buffer layer (for example, a buffer layer having a combination of different group-III nitride semiconductors such as AlN, AlGaN, GaN, and AlInGaN, not illustrated), a channel layer 90 (for example, a group-III nitride semiconductor such as GaN, InGaN, or AlInGaN), and a carrier supply layer 91 (for example, AlGaN or InAlGaN) including Al and having a band gap larger than that of the channel layer 90. A 2DEG layer 92 is formed on the channel layer 90 side at the interface between the channel layer 90 and the carrier supply layer 91 due to piezoelectricity and band gap difference. The carrier supply layer 91 has a surface provided with a recessed portion 99.

N-type capping layers 93 for achieving low contact resistance (for example, n-GaN, n-InGaN, or n-AlInGaN) are selectively formed in regions on the carrier supply layer 91 other than the recessed portion 99. Here, the n-type capping layers 93 are doped with impurities such as Si of at least $5 \times 10^{18}$ cm$^{-3}$ to form low-resistance n-type capping layers.

Furthermore, an etching stopper layer 94 (for example, a group-III nitride semiconductor such as AlGaN or AlInGaN) is formed so as to cover the carrier supply layer 91, the n-type capping layers 93, and the recessed portion 99. It may be that the etching stopper layer 94 comprises a group-III nitride semiconductor including Al to selectively remove an epitaxial layer to be subsequently formed thereon.

Figure 13:
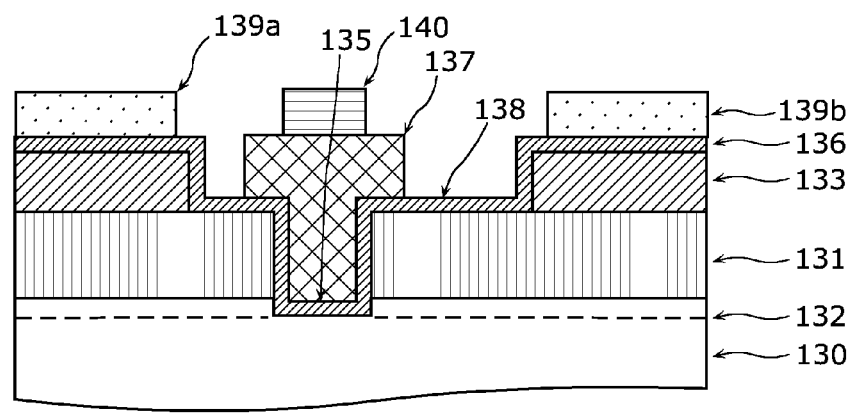
FIG. 13 is a schematic cross-sectional view illustrating an example of a structure of a recessed gate nitride semiconductor device which includes an etching stopper layer and a recessed portion having a bottom portion reaching a channel layer and which achieves both normally-off operation and low contact resistance.

The recessed portion 99 need not necessarily have a bottom within the carrier supply layer 91. As illustrated in FIG. 13, the recessed portion 99 may be a recessed portion 135 which penetrates a carrier supply layer 131. In such a case, an etching stopper layer 136 also serves as a threshold voltage control layer, and thus, needs to have an optimized thickness and Al composition.

A p-type capping layer 95 (for example, p-AlInGaN, p-InGaN, P—AlGaN, or p-GaN) doped with Mg or Zn and for achieving normally-off operation is selectively formed on the etching stopper layer 94 that is above the recessed portion 99 and in the region other than the selectively formed n-type capping layers 93. Formation of the p-type capping layer 95 on the etching stopper layer 94 causes a depletion region, due to a p-n junction, in a portion of the 2DEG layer 92 near immediately below the recessed portion 99 that is below the p-type capping layer 95, and thereby forming a portion with no 2DEG layer 92 (portion where the dashed line is discontinued in the drawing). This allows normally off operation.

When the p-type capping layer 95 is selectively formed, p-type impurities, such as Mg or Zn, in a p-type group-III nitride semiconductor layer that is before being selectively etched into the p-type capping layer 95 is diffused into the earlier formed etching stopper layer 94, which contacts the p-type group-III nitride semiconductor layer, the selectively formed n-type capping layers 93 and carrier supply layer 91. As a result, a p-type or high-resistance diffusion layer 96 is formed.

When the p-type impurities are Mg, the depth of diffusion is approximately a few nm to 30 nm, and the amount of diffused impurities is approximately $5 \times 10^{17}$ cm$^{-3}$ to $5 \times 10^{18}$ cm$^{-3}$. Accordingly, the region in which the diffusion layer 96 is formed by the diffusion of p-type impurities is determined by the relationship between the level of diffusion of the p-type impurities and the thickness of the etching stopper layer 94. More specifically, there are three cases where (a) the diffusion layer 96 is formed only in the surface layer of the etching stopper layer 94, (b) the diffusion layer 96 is formed across the entire etching stopper layer 94, but not reaching the n-type capping layers 93 or carrier supply layer 91, and (c) the diffusion layer 96 is formed across the entire etching stopper layer 94, and reaching the n-type capping layers 93 or the surface layer of the carrier supply layer 91. FIG. 11 illustrates the case of (a).

A source electrode 97a and a drain electrode 97b which form ohmic contacts are formed on the surface of the etching stopper layer 94 on the n-type capping layers 93. A gate electrode 98 which forms a Schottky contact or an ohmic contact is formed on the surface of the p-type capping layer 95. The source electrode 97a and the drain electrode 97b may be arranged at any position as long as these electrodes are located separately on either side of the p-type capping layer 95. The source electrode 97a and the drain electrode 97b may be formed by a known ohmic recess technique so as to contact any one of the channel layer 90, the carrier supply layer 91, the n-type capping layers 93, and the etching stopper layer 94, or may be formed on the surface of the etching stopper layer 94.

It may be that the p-type or high-resistance diffusion layer 96 is partially removed in the regions which contact the source electrode 97a and the drain electrode 97b. Alternatively, it may be that the p-type impurity concentration in the etching stopper layer 94 and the p-type impurity concentration in the surface of the n-type capping layers 93 are lower, by $1 \times 10^{17}$ cm$^{-3}$, than that in the surface layer of the etching stopper layer 94 on the carrier supply layer 91 which is in the region above which neither the p-type capping layer 95 nor the n-type capping layers 93 is formed.

Each of the source electrode 97a and the drain electrode 97b comprises an electrode including one metal or two or more metals selected from among Ti, Al, Mo, Hf and the like. The gate electrode 98 comprises an electrode including one metal or two or more metals selected from among Ti, Al, Ni, Pt, Pd, Au and the like.

Figure 12A:
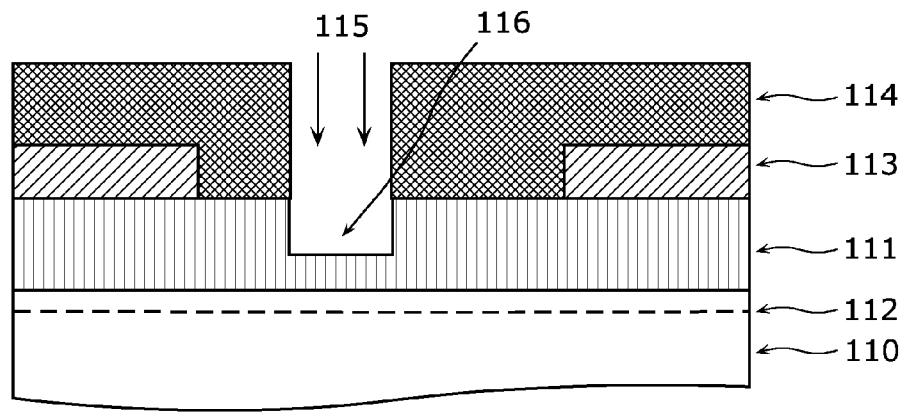
FIG. 12A is a schematic cross-sectional view for illustrating a method of manufacturing a recessed gate nitride semiconductor device which includes an etching stopper layer and achieves both normally-off operation and low contact resistance.

Next, FIG. 12A to FIG. 12E illustrate an example of a manufacturing method according to Embodiment 3. However, the elements of the manufacturing method described here are minimum elements for implementing embodiments of the present disclosure and are not limited thereto. Respective steps prior to FIG. 12A are substantially the same as those in the manufacturing method according to Embodiment 2 illustrated in FIG. 8A to FIG. 8C, and thus, their descriptions and illustration are omitted.

Relative to the structure in FIG. 8C, a resist pattern 114 is formed by a known photolithography, and a carrier supply layer 111 is partially removed by a known dry etching technique (for example, RIE or ICP-RIE) which includes plasma 44 using an etching gas such as Cl$_2$, BCl$_3$, O$_2$, Ar, or N$_2$, and thereby forming a recessed portion 116 (FIG. 12A). The recessed portion 116 need not necessarily have a bottom within the carrier supply layer 111. As illustrated in FIG. 13, the recessed portion 116 may be a recessed portion 135 which penetrates a carrier supply layer 131. In such a case, an etching stopper layer 136 also serves as a threshold voltage control layer, and thus, needs to have an optimized thickness and Al composition.

Figure 12B:
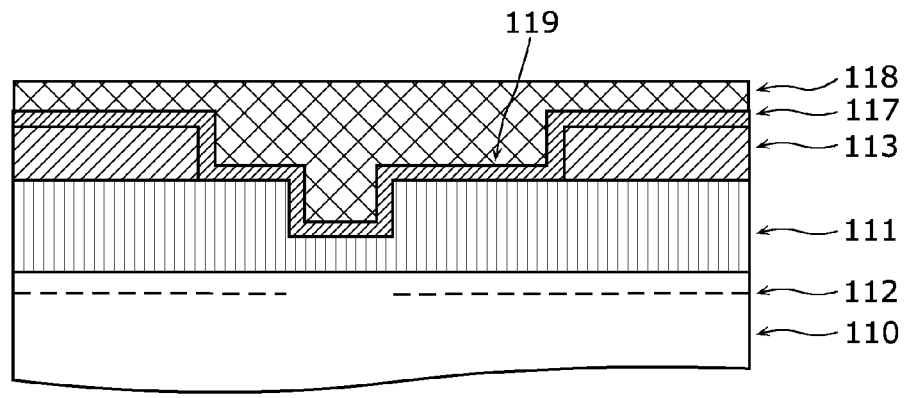
FIG. 12B is a schematic cross-sectional view for illustrating the method of manufacturing the recessed gate nitride semiconductor device which includes an etching stopper layer and achieves both normally-off operation and low contact resistance.

Next, an etching stopper layer 117 (for example, a group-III nitride semiconductor such as AlGaN or AlInGaN) and a p-type group-III nitride semiconductor layer 118 are grown by a known epitaxial method (for example, MOCVD) so as to cover the n-type capping layers 113, the carrier supply layer 111, and the recessed portion 116 (FIG. 12B). The p-type group-III nitride semiconductor layer 118 is a group-III nitride semiconductor layer doped with p-type impurities such as Mg or Zn, and may comprise p-AlInGaN, p-InGaN, p-AlGaN, or p-GaN. When the p-type group-III nitride semiconductor layer 118 is grown, p-type impurities, such as Mg or Zn, are diffused from the p-type group-III nitride semiconductor layer 118 into the earlier formed etching stopper layer 117, carrier supply layer 111, and n-type capping layers 113, and thereby forming a p-type or a high-resistance diffusion layer 119. When the p-type impurities are Mg, the depth of diffusion is approximately a few nm to 30 nm, and the amount of diffused impurities is approximately $5 \times 10^{17}$ cm$^{-3}$ to $5 \times 10^{18}$ cm$^{-3}$.

When epitaxially growing the etching stopper layer 117, it may be that unevenness of the surface need not be planarized as long as the etching stopper layer 117 is evenly grown. This is because the etching stopper layer 117 needs to etch stop the p-type group-III nitride semiconductor layer 118 formed thereon. In contrast, since the p-type group-III nitride semiconductor layer 118 is selectively removed, the p-type group-III nitride semiconductor layer 118 may be epitaxially grown in such a manner that the surface is planarized or the p-type group-III nitride semiconductor layer 118 is evenly grown. Formation of the p-type group-III nitride semiconductor layer 118 causes a depletion region, due to a p-n junction, in the 2DEG layer 112 near the portion immediately below the recessed portion below the p-type group-III nitride semiconductor layer 118, and thereby forming a portion with no 2DEG layer 112.

Furthermore, the etching stopper layer 117 also covers the side walls of the n-type capping layers 113. This prevents the side walls of the n-type capping layers 113 from being etched in the selective removal of the p-type group-III nitride semiconductor layer 118 that is to be described later. In general, in a group-III nitride semiconductor device, SiN, $SiO_2$, $Al_2O_3$ or the like is used as a surface protective layer in view of surface protection and reduction in surface level and current collapse. If no etching stopper layer 117 is present and the side walls of the n-type capping layers 113 are etched and dent, voids might occur between the surface protective film such as SiN, $SiO_2$ or $Al_2O_3$ and the side walls of the n-type capping layers 113. Occurrence of such voids at the side walls of the n-type capping layers 113 results in the nitride semiconductor surface being partially unprotected, which causes electron traps in the surface level and can cause current collapse. Hence, it is very important that the etching stopper layer 117 covers the side walls of the n-type capping layers 113.

Figure 12C:
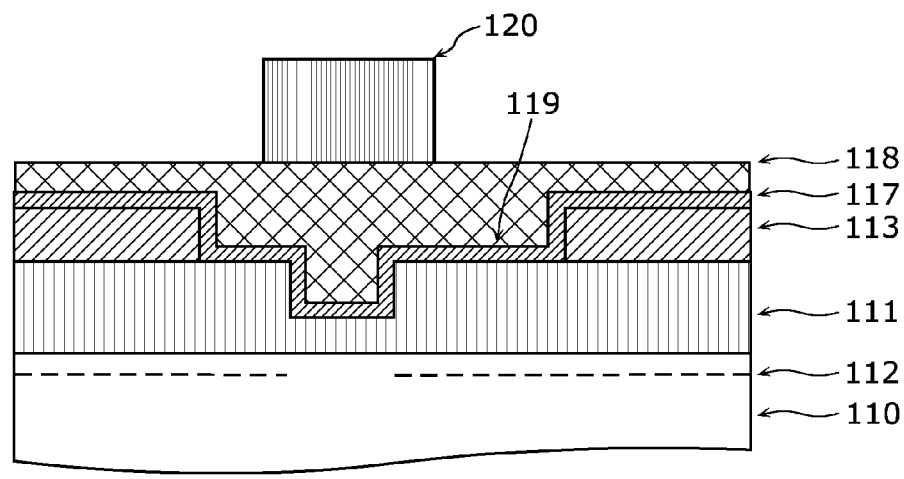
FIG. 12C is a schematic cross-sectional view for illustrating the method of manufacturing the recessed gate nitride semiconductor device which includes an etching stopper layer and achieves both normally-off operation and low contact resistance.

Next, a resist pattern 120 is formed by a known photolithography technique (FIG. 12C).

Figure 12D:
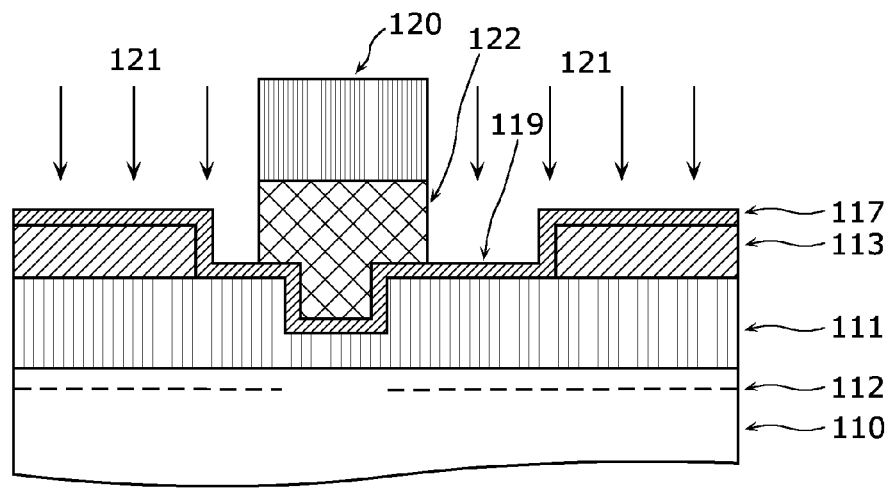
FIG. 12D is a schematic cross-sectional view for illustrating the method of manufacturing the recessed gate nitride semiconductor device which includes an etching stopper layer and achieves both normally-off operation and low contact resistance.

Next, the p-type group-III nitride semiconductor layer 118 is partially removed by a known dry etching technique (for example, RIE or ICP-RIE) which includes plasma 121 using etching gas such as $Cl_2$, $BCl_3$, $O_2$, Ar, or $N_2$, and a p-type capping layer 122 partially left is formed (FIG. 12D). It may be that the dry etching technique is a known selective etching, and that etching is stopped near the surface of the etching stopper layer 117.

Furthermore, due to reaction with Al, selective etching of a group-III nitride semiconductor layer stops, or its etching rate decreases at a certain level of selectivity (for example, the etching rate of the p-type group-III nitride semiconductor layer 118 is at least twice as high as the etching rate of the carrier supply layer 117). Hence, it may be that the underlying etching stopper layer 117 has an Al composition higher than that of the p-type group-III nitride semiconductor layer 118 above, or that the p-type group-III nitride semiconductor layer 118 includes no Al. Furthermore, formation of the p-type capping layer 122 causes a depletion region, due to a p-n junction, in the 2DEG layer 112 near the portion immediately below the recessed portion 116 below the p-type capping layer 122, and thereby forming a portion with no 2DEG layer 112. This allows normally-off operation.

The threshold voltage (Vth) of the nitride semiconductor device according to Embodiment 3 significantly depends on the thickness and composition of the carrier supply layer 111 from the bottom surface of the recessed portion 116, the thickness and composition of the etching stopper layer 117, and the doping concentration of p-type impurities, thickness, and composition of the p-type group-III nitride semiconductor layer 118 formed thereon. This requires close inspection of the thickness, doping concentration, and composition of each layer.

Furthermore, the etching stopper layer 117 is formed which has a material composition inactive to an etching gas used for etching the p-type group-III nitride semiconductor layer 118. Hence, over-etch after completely removing a portion of the p-type group-III nitride semiconductor layer 118 does not result in removal of the n-type capping layers 113. In such a manner, compared to Embodiment 1, the manufacturing method according to Embodiment 3 further facilitates manufacturing of a semiconductor device having an excellent reproducibility and surface distribution of contact resistance.

Figure 12E:
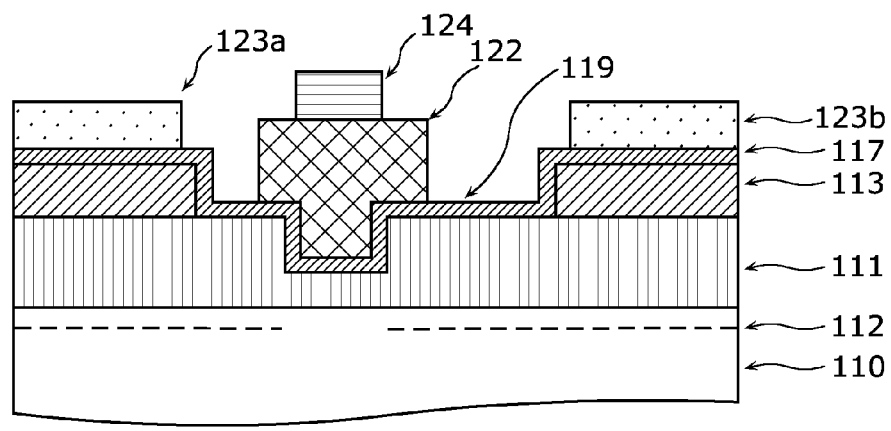
FIG. 12E is a schematic cross-sectional view for illustrating the method of manufacturing the recessed gate nitride semiconductor device which includes an etching stopper layer and achieves both normally-off operation and low contact resistance.

Next, the resist pattern 120 is removed by using a known organic solvent cleaning, acid cleaning or the like, to clean the surface of the epitaxial substrate. Subsequently, a source electrode 123a and a drain electrode 123b which form ohmic contacts are formed on the etching stopper layer 117 that is on the n-type capping layers 113 located separately on either side of the p-type capping layer 122, by a known photolithography, evaporation method, lift-off, annealing, or the like. A gate electrode 124 which forms a Shottky contact or an ohmic contact is formed on the surface of the p-type capping layer 122 (FIG. 12E).

The source electrode 123a and the drain electrode 123b may be arranged at any position as long as these electrodes are located separately on either side of the p-type capping layer 122. The source electrode 123a and the drain electrode 123b may be formed by a known ohmic recess technique so as to contact any one of the channel layer 110, the carrier supply layer 111, the n-type capping layers 113, and the etching stopper layer 117, or may be formed on the surface of the etching stopper layer 117. Each of the source electrode 123a and the drain electrode 123b comprises an electrode including one metal or two or more metals selected from among Ti, Al, Mo, Hf and the like. The gate electrode 124 comprises an electrode including one metal or two or more metals selected from among Ti, Al, Ni, Pt, Pd, Au and the like.

Formation of an ohmic electrode on the surface of the etching stopper layer 117 results in formation of an ohmic electrode on the surface of the p-type or high-resistance diffusion layer 119. This is highly likely to cause poor ohmic contacts. Hence, it may be that the p-type or high-resistance diffusion layer 119 is removed by a few nm to 30 nm approximately. The removal method is substantially the same as the method illustrated in FIG. 9A to FIG. 9D according to Embodiment 2, and thus, its description is omitted here.

Such a structure, in which the etching stopper layer 94 and the n-type capping layers 93 are provided between the carrier supply layer 91 and the source electrode 97a and the drain electrode 97b which are ohmic electrodes, changes the band structure, and thereby providing low contact resistance. The mechanism is the substantially the same as that illustrated in FIG. 10 according to Embodiment 2.

As described above, the method of manufacturing a semiconductor device according to Embodiment 3 includes: preparing a substrate; forming a first nitride semiconductor layer (the channel layer 90) above the substrate; stacking, above the first nitride semiconductor layer (the channel layer 90), a second nitride semiconductor layer (the charier supply layer 91) having a band gap larger than a band gap of the first nitride semiconductor layer (the channel layer 90); stacking a third nitride semiconductor layer (the n-type capping layer 93) above the second nitride semiconductor layer (the carrier supply layer 91); selectively removing a portion of the third nitride semiconductor layer to form the capping layer 93 comprising the third nitride semiconductor layer; forming a recessed portion in a portion of the second nitride semiconductor layer (the carrier supply layer 91); stacking the etching stopper layer 94 comprising a fourth nitride semiconductor layer and a p-type nitride semiconductor layer so as to cover the capping layer 93 comprising the third nitride semiconductor layer and the recessed portion; selectively removing a portion of the p-type nitride semiconductor layer above the etching stopper layer 94 to form the capping layer 95 comprising the p-type nitride semiconductor layer; forming a first ohmic electrode and a second ohimc electrode above the capping layer comprising the fourth nitride semiconductor layer (the etching stopper layer 94) located above the capping layer 93 comprising the third nitride semiconductor layer; and forming the gate electrode 98 above the capping layer comprising the p-type nitride semiconductor layer (the p-type capping layer 95).

In Embodiment 1, the thickness of the n-type capping layers 93 is reduced by dry etching performed for forming the p-type capping layer 95. The above structure according to Embodiment 3 does not involve such a reduction, which leads to excellent productivity and reproducibility of contact resistance. The etching stopper layer 94 in the above structure covers the side walls of the n-type capping layers 93 as well, and therefore, the sidewalls of the n-type capping layer 93 is prevented from being etched when forming the p-type capping layer 95. In general, in a group-III nitride semiconductor device, SiN, $SiO_2$, $Al_2O_3$ or the like is used as a surface protective layer in view of surface protection and reduction in surface level and current collapse. If no etching stopper layer 94 is present and the side walls of the n-type capping layers 93 are etched and dent, voids might occur between the surface protective film such as SiN, $SiO_2$ or $Al_2O_3$ and the side walls of the n-type capping layers 93. Occurrence of such voids at the side walls of the n-type capping layers 93 results in the nitride semiconductor surface being partially unprotected, which causes electron traps in the surface level and can cause current collapse. Hence, it is very important that the etching stopper layer 94 covers the side walls of the n-type capping layers 93.

Furthermore, increasing the resistance of the semiconductor surface of the diffusion layer 96 where p-type impurities are diffused can reduce leakage current flowing from the gate electrode 98 to the drain electrode 97b and from the gate electrode 98 to the source electrode 97a passing through a portion near the semiconductor surface. In particular, in the case where the n-type capping layer 93 on the source electrode 97a side and the p-type capping layer 95 are formed close at the maximum limit of process margin in order to reduce source resistance, the diffusion layer 96 which increases the resistance of the semiconductor surface and into which p-type impurities are diffused is necessary for reducing leakage current between gate and source.

FIG. 11 illustrates an example where the diffusion layer 96 is present in the entire surface layer of the etching stopper layer 94 covering the n-type capping layers 93 and the carrier supply layer 91, the diffusion layer 96 is not limited to such an example. The diffusion layer 96 for reducing leakage current from the gate electrode 98 to the drain electrode 97b and from the gate electrode 98 to the source electrode 97a may be located at any position as long as the diffusion layer 96 is in the surface layer of the etching stopper layer 94 that is between the gate electrode 98 and the source electrode 97a and the gate electrode 98 and the drain electrode 97b (not illustrated).

According to the above structure, a nitride semiconductor device which achieves both low contact resistance and normally-off operation can be easily manufactured, and which has a good reproducibility and surface distribution of contact resistance. Furthermore, with the recessed structure, the threshold value is controlled by the depth of the recessed portion. Accordingly, the carrier supply layer 91 can be sufficiently thick, allowing the surface of the carrier supply layer 91 to be physically far from the 2DEG layer 92. Hence, it is possible to manufacture a nitride semiconductor device with reduced current collapse.

Furthermore, as illustrated in FIG. 13, the recessed portion 135 has a bottom reaching the channel layer 130 penetrating the carrier supply layer 131. Hence, the threshold voltage of the nitride semiconductor device is controlled only by the thickness of the etching stopper layer 136 independently of the depth of the recessed gate or the thickness of the carrier supply layer 131. This significantly increases evenness of threshold values within the wafer surface.

Figure 14:
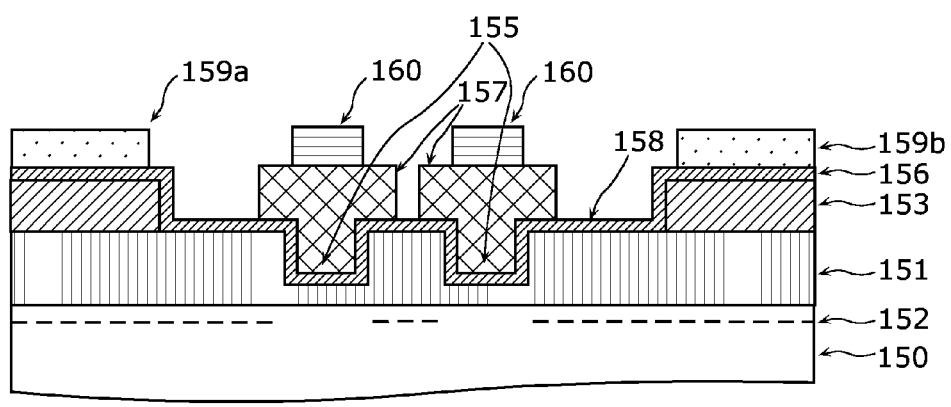
FIG. 14 is a schematic cross-sectional view illustrating each element in part of process of manufacturing a double recessed gate nitride semiconductor device which includes an etching stopper layer and achieves both normally-off operation and low contact resistance.

FIG. 14 illustrates a nitride semiconductor device which includes an etching stopper layer and two recessed gates and which achieves both low contact resistance and normally-off operation according to a variation of Embodiment 3. In Embodiment 3, a description is given of group-III nitride semiconductors, but the present disclosure is not limited thereto.

The structure according to the variation is substantially the same as that in Embodiment 3, but includes two recessed portions 155, two p-type capping layers 157, and two gate electrodes 160 between a source electrode 159a and a drain electrode 159b. With the structure, voltage applied to each gate electrode 160 is independently controlled, which allows bidirectional FET operation.

Each of the recessed portions 155 need not necessarily have a bottom within the carrier supply layer 151. As illustrated in FIG. 13, the recessed portions 155 may be the recessed portions 135 which penetrate the carrier supply layer 131. In such a case, the etching stopper layer 136 also serves as a threshold voltage control layer, and thus, needs to have an optimized thickness and Al composition.

The method of manufacturing the structure above is substantially the same as that in Embodiment 3, and thus, its descriptions are omitted here.

Although only some exemplary embodiments of the present disclosure have been described in detail above, those skilled in the art will readily appreciate that many modifications are possible in the exemplary embodiments without materially departing from the novel teachings and advantages of the present disclosure. Accordingly, all such modifications are intended to be included within the scope of the present disclosure.

INDUSTRIAL APPLICABILITY

The present disclosure is useful for a semiconductor device, comprising different nitride semiconductors, such as a power transistor used in a power circuit or the like, and a method of manufacturing such a semiconductor device.

The invention claimed is:
1. A semiconductor device comprising:
a substrate;
a first nitride semiconductor layer above the substrate;
a second nitride semiconductor layer above the first nitride semiconductor layer and having a band gap larger than a band gap of the first nitride semiconductor layer;
a p-type nitride semiconductor layer above a portion of the second nitride semiconductor layer;
two third nitride semiconductor layers of n-type and above the second nitride semiconductor layer, the two third nitride semiconductor layers being located separately on either side of the p-type nitride semiconductor layer; and a first ohmic electrode and a second ohmic electrode, the first ohmic electrode being located above one of the two third nitride semiconductor layers, the second ohmic electrode being located above the other of the two third nitride semiconductor layers; and a gate electrode above the p-type nitride semiconductor layer, wherein the second nitride semiconductor layer includes, in a region above which neither the p-type nitride semiconductor layer nor the two third nitride semiconductor layers is located, a surface layer including a p-type impurity identical to a p-type impurity included in the p-type nitride semiconductor layer.

2. The semiconductor device according to claim 1, wherein each of the two third nitride semiconductor layers includes a surface layer including no p-type impurity identical to the p-type impurity included in the p-type nitride semiconductor layer.

3. The semiconductor layer according to claim 1, wherein a relation of $(Y-X) > 1 \times 10^{17}$ cm$^{-3}$ is satisfied where X represents an amount of a p-type impurity included in surface layers of the two third nitride semiconductor layers and Y represents an amount of the p-type impurity included in the surface layer in the region of the second nitride semiconductor layer above which neither the p-type nitride semiconductor layer nor the two third nitride semiconductor layers is formed.

4. The semiconductor device according to claim 1, further comprising a fourth nitride semiconductor layer between the first ohmic electrode and the one of the two third nitride semiconductor layers, between the second ohmic electrode and the other of the two third nitride semiconductor layers, and between the second nitride semiconductor layer and the p-type nitride semiconductor layer, the fourth nitride semiconductor layer having a material composition inactive to an etching gas used for the p-type nitride semiconductor layer.

5. The semiconductor device according to claim 4, wherein the fourth nitride semiconductor layer covers a side wall of each of the two third nitride semiconductor layers.

6. The semiconductor device according to claim 4, wherein the second nitride semiconductor layer includes a recess structure in a portion below the p-type nitride semiconductor layer.

7. The semiconductor layer according to claim 6, wherein the recess structure has a bottom which penetrates the second nitride semiconductor layer and reaches the first nitride semiconductor layer.

8. The semiconductor device according to claim 4, wherein at least one of the first ohmic electrode or the second ohmic electrode contacts a corresponding one of the two third nitride semiconductor layers.

9. The semiconductor device according to claim 8, wherein at least one of the first ohmic electrode or the second ohmic electrode further contacts a two-dimensional electron gas region in an upper portion of the first nitride semiconductor layer.

10. The semiconductor device according to claim 1, wherein the two third nitride semiconductor layers have an aluminum (Al) composition lower than an Al composition of the second nitride semiconductor layer.

11. The semiconductor device according to claim 1, wherein the two third nitride semiconductor layers have a band gap smaller than the band gap of the second nitride semiconductor layer.

12. The semiconductor device according to claim 1, wherein the two third nitride semiconductor layers comprise $Al_x In_y Ga_z N$ (where $0 \leq x, y, z \leq 1$).

13. The semiconductor device according to claim 1, wherein the two third nitride semiconductor layers comprise silicon (Si) of at least $5 \times 10^{18}$ cm$^{-3}$.

14. A nitride semiconductor device comprising:

a substrate;

a first nitride semiconductor layer above the substrate;

a second nitride semiconductor layer above the first nitride semiconductor layer and having a band gap larger than a band gap of the first nitride semiconductor layer;

a p-type nitride semiconductor layer above a portion of the second nitride semiconductor layer;

two third nitride semiconductor layers of n-type and above the second nitride semiconductor layer, one of the two third nitride semiconductor layers being located on one side of the p-type nitride semiconductor layer and the other of the two third nitride semiconductor layers being located on the other side of the p-type nitride semiconductor layer;

a first ohmic electrode and a second ohmic electrode, the first ohmic electrode being located above one of the two third nitride semiconductor layers, the second ohmic electrode being located above the other of the two third nitride semiconductor layers;

a gate electrode above the p-type nitride semiconductor layer; and a fourth nitride semiconductor layer between the first ohmic electrode and the one of the two third nitride semiconductor layers, between the second ohmic electrode and the other of the two third nitride semiconductor layers, and between the second nitride semiconductor layer and the p-type nitride semiconductor layer, the fourth nitride semiconductor layer comprising a material composition inactive to an etching gas used for the p-type nitride semiconductor layer.

* * * * *